United States Patent [19]
Bienz

[11] Patent Number: 5,414,738
[45] Date of Patent: May 9, 1995

[54] MAXIMUM LIKELIHOOD PATHS COMPARISON DECODER

[75] Inventor: Richard A. Bienz, Chandler, Ariz.

[73] Assignee: Motorola, Inc., Schaumburg, Ill.

[21] Appl. No.: 151,581

[22] Filed: Nov. 9, 1993

[51] Int. Cl.$^6$ .................... H03D 1/00; H04L 27/06
[52] U.S. Cl. ........................ 375/341; 371/43
[58] Field of Search ............. 375/39, 94, 75; 371/43

[56] References Cited

U.S. PATENT DOCUMENTS

| | | | |
|---|---|---|---|
| 4,677,625 | 6/1987 | Betts et al. | 375/39 X |
| 5,128,967 | 7/1992 | Durkin et al. | 375/83 |
| 5,233,629 | 8/1993 | Paik et al. | 375/39 |

OTHER PUBLICATIONS

Joachim Hagenauer, "Soft–In/Soft–Out the Benefits of Using Soft Values in all Stages of Digital Receivers", presented at the Third International Workshop on Digital Signal Processing Techniques Applied to Space Communications, organized by the European Space Agency in cooperation with Eutelsat and Inmarsat in Estec, Noordwijk, The Netherlands, 23–25 Sep. No year is noted on the available copy of this document. A Dialog search (copy attached) indicates that the conference occurred on those dates in 1992, but no publication date was found. It is not presently known whether publication of the above-noted article occurred at or after the workshop.

*Primary Examiner*—Stephen Chin
*Assistant Examiner*—Tesfaldet Bocure
*Attorney, Agent, or Firm*—Robert M. Handy

[57] ABSTRACT

There is described an apparatus and method for decoding signals produced by a communication system employing cascading or concatenation of error control codes that contain, for example, short memory convolution codes. A novel inner decoder and method is described which is a modified Viterbi decoder that generates soft decisions by using a subset of the operations performed by a normal, hard decision, Viterbi decoder. Results of simulation tests show that the performance of the novel decoder provides a bit error rate performance that matches the theoretical bit error rate for the various signal to noise ratios, which performance is better than decoders previously available. Several implementations are described and compared.

10 Claims, 18 Drawing Sheets

FIG. 1
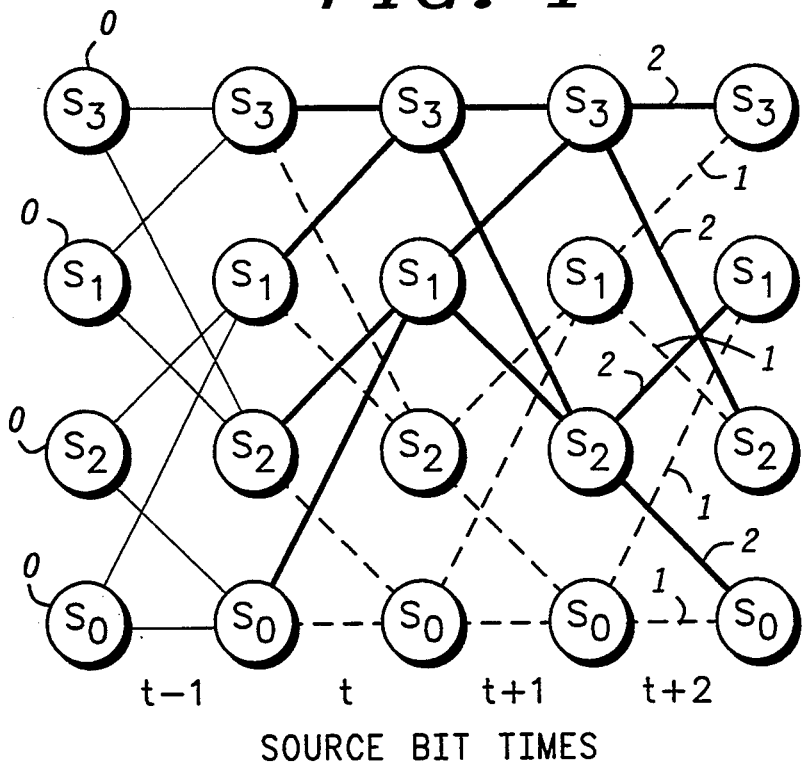
SOURCE BIT TIMES
— PATHS THROUGH TRELLIS WITH SOURCE BIT=1 AT BIT TIME T
--- PATHS THROUGH TRELLIS WITH SOURCE BIT=0 AT BIT TIME T
ENCODER MEMORY=2
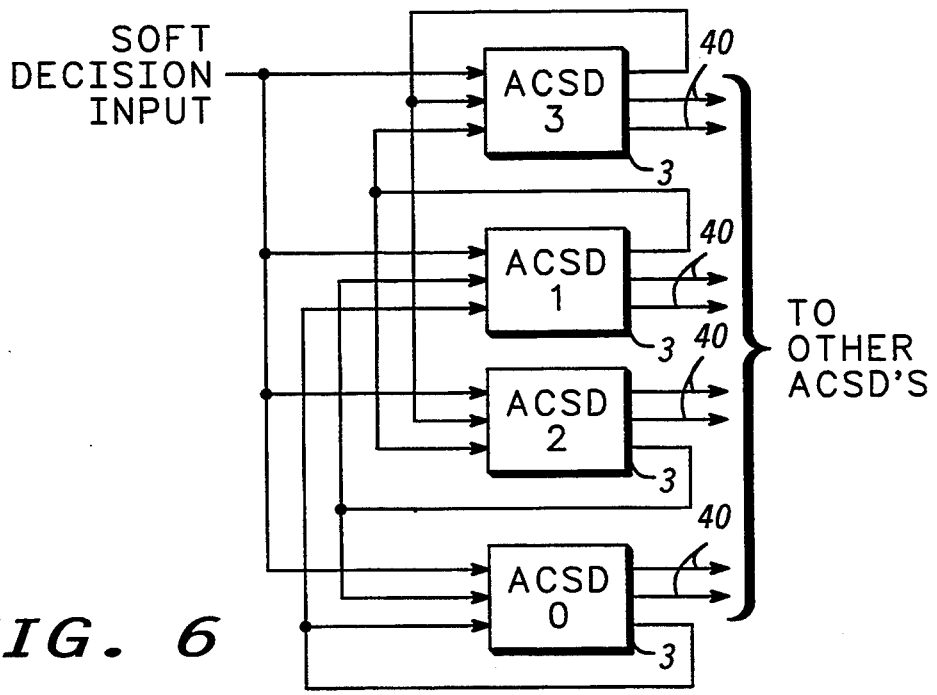
FIG. 6

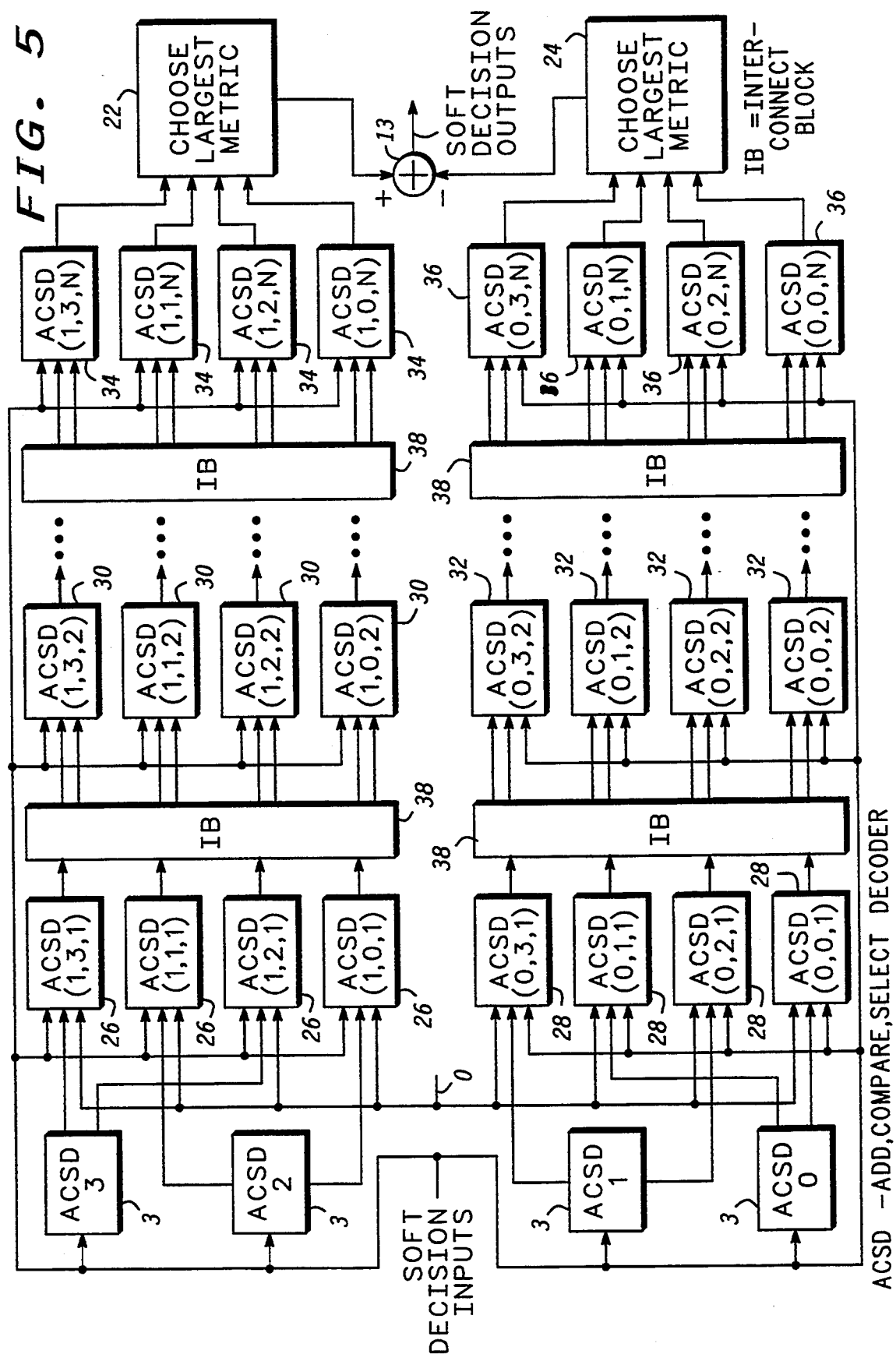

5,414,738

MAXIMUM LIKELIHOOD PATHS COMPARISON DECODER

BACKGROUND OF THE INVENTION

The present invention pertains to decoders used in communication systems.

Encoders and decoders are used in communication systems in order to, among other things, increase the robustness of transmission of information through a noisy channel. The cascading or concatenation of error control codes is a well known technique in digital communications. This type of code can yield excellent bit error rate performance. Concatenated codes that contain short memory convolution codes are applicable to many communication links. The applications include various combinations of modulations with memory, channels with memory and coding with memory. The Maximum Likelihood decoder (MLD) is the decoder of choice for these concatenated coding schemes. A Viterbi decoder is an example of an MLD decoder. Unfortunately, prior art MLDs produce only hard decisions. The MLDs near the channel (inner decoders) therefore do not send all the available symbol information (soft decisions) to the outer decoders. Also, there are no practical decoders that produce this symbol information. The result is an unrealized coding gain of 2 dB or more depending upon the channel type.

SUMMARY OF THE INVENTION

In accordance with the present invention, there is provided a novel channel decoder and method that make use of all of the available symbol information being transmitted through the channel, that is, a soft decision output decoder and method. Several embodiments are described that can be used as an inner decoder in a concatenated convolution coding scheme. This decoder and method employ a modified MLD decoder that generates soft decisions and is referred to as a Maximum Likelihood Paths Comparison (MLPC) decoder. The invented MLPC decoder uses a subset of the operations performed by a normal MLD and therefore is practical.

More particularly, a method for decoding information coded by an encoder having a memory length of m bits and transmitted through a noisy channel is provided, comprising, comparing the transmitted information to all possible predetermined output states of the encoder to determine for each bit received through the channel a first $2^m$ set of metric sums representing the likelihood that a one was input to the encoder, and a second $2^m$ set of metric sums representing the likelihood that a zero was input to the encoder, passing the first $2^m$ set of metric sums through a first trellis decoder to produce a first output, passing the second $2^m$ set of metric sums through a second trellis decoder to produce a second output, selecting a first maximum metric sum from the first output and a second maximum metric sum from the second output, and subtracting the first and second maximum metric sums to determine a probability that a one or zero was encoded by the encoder.

There is further provided an apparatus for decoding information coded by an encoder having a memory length of m bits and transmitted through a noisy channel, comprising, an input add-compare-select decoder for receiving the transmitted information and producing a first input containing information on the likelihood that the encoded bit was a one and a second output containing information on the likelihood that the encoded bit as a zero, a first multiplicity of sequentially connected add-compare-select decoders, the first thereof receiving the first output and the last thereof producing a first further output, a second multiplicity of sequentially connected add-compare-select decoders, the first thereof receiving the second input and the last thereof producing a second further output, a first selector for receiving the first further output and selecting therefrom a first maximum sum of probabilities that the encoded bit was a one, a second selector for receiving the second further output and selecting therefrom a second maximum sum of probabilities that the encoded bit was a zero, and a subtractor for determining the difference between the first and second maximum sum of probabilities to determine a net probability that a one or zero was encoded by the encoder.

BRIEF DESCRIPTION OF THE DRAWING

In FIG. 1, there is shown a trellis diagram of all the path comparisons a Viterbi decoder makes over one constraint length of a code with memory length equal to 2.

In FIG. 5, there is shown a detailed schematic of an architecture 3 decoder for an encoder with memory length of 2.

In FIG. 6, there is shown a detailed schematic of the ACSD interconnections for ACSDs 0,1,2 and 3 shown in FIG. 5.

DESCRIPTION OF THE PREFERRED EMBODIMENT

MATHEMATICAL DEVELOPMENT OF INVENTION THE A POSTERIORI PROBABILITY DECODER

Figure 2:
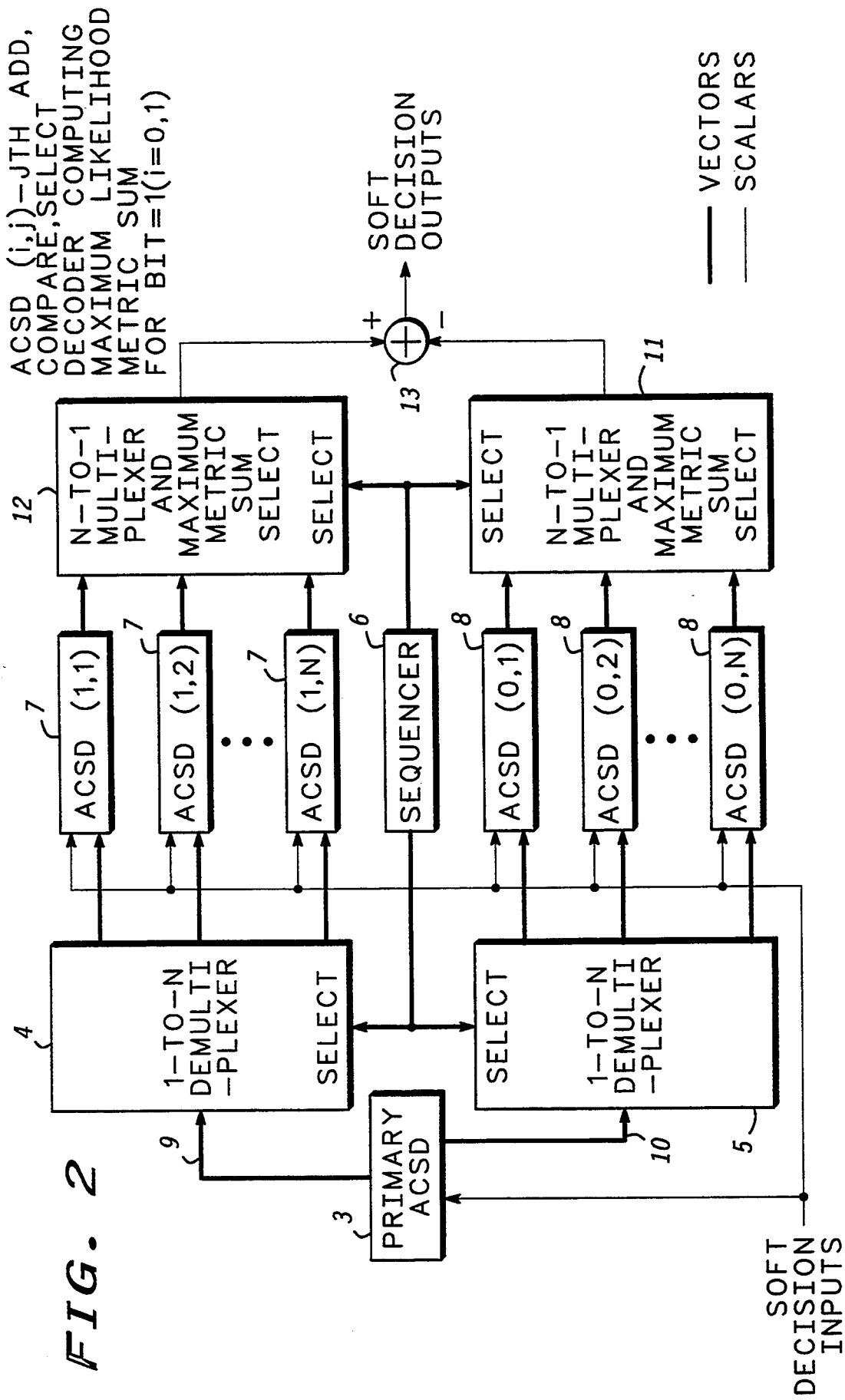
In FIG. 2, there is shown a schematic diagram of architecture 1 of the MLPC decoder invention.

The a posteriori decoder computes the probability of correctness for each decoded symbol. Symbol decisions are based on this probability and it therefore minimizes the probability of symbol error. It is optimum in this sense. This decoder is the one of choice for the inner decoder in a concatenated convolutional coding scheme. The decoder could generate symbol reliability information for use by the outer decoder.

The a posteriori decoder operation can be described mathematically. Let $u = (u_1, u_2, \ldots, u_L)$ be the information sequence, where $u_j$ is an element from an alphabet of size M, $u_j \in (S_1, S_2, \ldots, S_M)$, $M = 2^k$ and $(1 \leq j \leq L)$. Also, $v = (v_1, v_2, \ldots, v_L)$ is the resulting codeword sequence. The received sequence is, $r = (r_1, r_2, \ldots, r_L)$. The probability that the information symbol $u_j$ equals $S_i$ ($1 \leq i \leq 2^k$) is:

$$P(u_j = S_i | r) = \frac{\sum_{v, u_j = S_i} P(v|r)}{\sum_v P(v|r)} \tag{1}$$

The equation in the numerator limits the summation to all possible sequences of v where $u_j = S_i$. The equation in the denominator is a summation over all possible codeword sequences and is equal to one. Normally the denominator would be eliminated but it is needed for the mathematical development here.

Using Bayes rule, (1) can be rewritten as:

$$P(u_j = S_i | r) = \frac{\sum_{v, u_j = S_i} P(r|v)P(v)}{\sum_v P(r|v)P(v)} \tag{2}$$

If all codeword sequences are assumed to be equally likely then $P(v)$ is a constant for all v and (2) simplifies to:

$$P(u_j = S_i | r) = \frac{\sum_{v, u_j = S_i} P(r|v)}{\sum_v P(r|v)} \tag{3}$$

A modification to equation (3) occurs when the memoryless channel assumption is applied. With this assumption, (3) becomes:

$$P(u_j = S_i | r) = \frac{\sum_{v, u_j = S_i} \prod_{m=1}^{L} P(r_m|v_m)}{\sum_v \prod_{m=1}^{L} P(r_m|v_m)} \tag{4}$$

With the above assumptions, equation (4) is the brute force method of optimally decoding the received sequence r. All values of v(as allowed by the convolutional code) are examined for each information symbol. Even for a sequence of short length, this task is too complex.

Assume that the signal-to-noise ratio is relatively high. One sequence, v will tend to dominate in probability given r. Also, assume that $u_j$ which helps produce v is not $S_i$ but Sq. With these assumptions, (4) can be approximated by:

$$P(u_j = S_i | r) = \frac{\sum_{v, u_j = S_i} \prod_{m=1}^{L} P(r_m|v_m)}{\max_{v, u_j = S_q} \prod_{m=1}^{L} P(r_m|v_m)} \tag{5}$$

Now assume when $U_i = S_j$ a single sequence dominates in probability over all other sequences with $u_j = S_i$ Equation (5) then becomes:

$$P(u_j = S_i | r) = \frac{\max_{v, u_j = S_i} \prod_{m=1}^{L} P(r_m|v_m)}{\max_{v, u_j = S_q} \prod_{m=1}^{L} P(r_m|v_m)} \tag{6}$$

If the logarithm of each side of (6) is taken, the result is:

$$\max_{v, u_j = S_i} \sum_{m=1}^{L} \log[P(r_m|v_m)] - \max_{v, u_j = S_q} \sum_{m=1}^{L} \log[P(r_m|v_m)] \tag{7}$$

It is reasonable to assume that (7) yields results that are very close to those of (4) when the signal-to-noise ratio is relatively high.

Equation (7) is the key to the new decoder. The right-hand side of this approximation has two different components. The first, left of the minus sign, is the maximum likelihood sequence metric sum when $u_j = S_i$. The other component is the maximum likelihood sequence metric sum when the $u_j = S_q$. Therefore, $\log[P(u_j = S_i | r)]$ can be approximated by the difference between these two maximum likelihood metric sums. This metric difference can be used as a soft decision input to an outer MLD. The new decoder that performs the calculation in (7)

has been named (by the inventor) the maximum likelihood paths comparison (MLPC) decoder.

Equation (7) can be calculated using two different MLD-like decoders. Both decoders are constrained. The first decoder constraint is $u_j$ is forced to $S_i$. In the second decoder, $u_j$ is forced $S_q$. The decoders operations are the same as a MLD (add, compare and select—ACS) except they do not need to maintain path information. All they need to calculate is a metric sum. Since this new decoder performs only ACS operations, it avoids multiplication or table-lookup operations needed in the optimum a posteriori probability decoder.

In general, to obtain reliability information for a symbol with alphabet size $2^k$ requires $2^k$ ACS decoders (ACSDs). Each decoder calculates the reliability information for a unique element of the alphabet. Here, $k=1$ and therefore only two ACSDs are needed per information symbol.

The question that now arises is: does a MLPC decoder asymptotically approach the optimum one in performance. Simulated bit error rate results of a concatenated convolutional coding scheme, using the new decoder, are presented. These results are compared to the upper bound bit error rate.

A variety of different architectures are presented next for the new MLPC decoder. The advantages and disadvantages of each are discussed. The architectures that appear the most efficient to implement are identified.

MLPC DECODER ARCHITECTURES EFFICIENT IMPLEMENTATION AND OPERATION OF A MLPC DECODER

The new MLPC decoder is a modified ELD. It uses the same operations a normal ELD does(ACS—see FIG. 9) but does not maintain path histories. The decoder produces soft decisions by comparing the metric sum of two 'constrained' maximum likelihood (EL) paths. The first ML path constraint is, the information bit at time t is forced to a one. The second ML path constraint is a zero for the same bit. One of these two paths is the unconstrained ML path. The decoder iteratively finds these two constrained paths for all t(all information bits). It calculates the difference between the two constrained ML path metric sums. This difference calculation is performed for each bit and is the soft decision.

Modification of a ELD is required because it generates hard decisions only. When a ELD makes a bit decision all survivors usually have the same bit state. Paths with the opposite bit state have typically been eliminated. Consequently, constrained ML path metric sum comparisons with a normal ELD are not possible. The ML algorithm must be modified to ensure that the two constrained ML paths survive.

Calculating equation (7) for every information bit would require a large amount of hardware. One reduction in complexity is obtained by truncation. In a normal MLD, a decision can be made after a few constraint lengths with a minimal loss in performance. The same is expected to be true for the new decoder and its two constrained paths. This significantly reduces the amount of decoder hardware needed. This issue was explored using simulation. The results are presented later.

Further efficiency improvements are needed to calculate (7) for every bit. Another possibility is to avoid beginning each constrained path decoding at the start of the transmitted sequence. A decoder architecture that utilizes previous calculations to eliminate pending ones causes another large complexity reduction. A method to do this is explained next.

A MLD does not begin comparing paths with opposite state bits in the interval t until one encoder memory length later (during interval t+m). FIG. 1 illustrates this fact using the trellis from a memory size two code. The solid lines 2 in this figure are possible paths followed in the trellis with a one for source bit $u_j$. The dotted lines 1 represent the paths for a zero state for $u_j$. Note that during bit intervals t and t+1, solid line paths 2 merge into states with other solid line paths 2 only. Thus, paths with a one for $u_j$ eliminate other paths with a one for the same bit during these two time intervals. The same is true for the paths (see FIG. 1, line 1) with a zero for $u_j$ 1. Also note in the figure that solid line 2 and dotted line 1 paths do not converge to the same states 0 until bit time t+2.

The source bit times in the figure correspond to the following encoder states:

1. During time t, $u_j$ is in the first memory element of the encoder.
2. In time t+1 interval, $u_j$ is in the second memory element of the encoder.
3. During time t+2, $u_j$ has just been shifted out of the encoder.

The above characteristic of a MLD is exploited in the new MLPC decoder to significantly reduce its complexity. The conceptual time when the decoding algorithm must be modified to prevent complementary path compares and selects is in the time interval t+2.

A way to avoid opposite state path elimination is by using multiple ACSDs. Assume that a second and third ACSD are available. In FIG. 1, the solid line 2 metric sums at time t+2 (paths with a one in bit interval t) are passed to the second ACSD. The dotted line 1 metric sums at time t+2 (paths with a zero in bit interval t) are sent to the third decoder. The first (primary) ACSD continues decoding the unconstrained ML path. The second decoder finds the constrained ML path with a one at bit time t. The third decoder finds the constrained ML path with a zero at time t. At time t+path truncation length (t+TL), the maximum metric sums are selected by the second and third decoders. These sums are then subtracted. This is the soft decision for the bit at time t.

The second and third ACSDs can be reused for soft decision calculations. The next bit time that they can operate is not until t+TL though. They would then soft decision decode the bit at time t+TL-m where m is the encoder memory (two in this case). An additional TL-m-1 decoder pairs are therefore required to soft decision decode all bits between bit times t and t+TL-m. These decoders could be multiplexed in a round-robin fashion to produce bit level soft decisions for all bits. The total number of ACSDs, including the primary decoder, is thus 2 (TL-m)+1.

By using the first ACSD as described, a significant complexity reduction occurs. If there is no decoder operating like the first one, then many more decoders are required. The total number of decoders is then about 4TL+2 (about 4-5 constraining lengths before and after each bit multiplied by 2 decoders per bit). This is a savings of 2 (TL+m)+1 decoders. Many more are needed without the first decoder because each requires about TL source bits to synchronize. Without this synchronization phase the decoder soft decisions are not very reliable.

An initial inspection indicates that the complexity from all the additional decoders is large. Fortunately, the ACSDs here are simplified relative to ones used in normal MLDs. These ACSDs do not need to maintain the survivor paths of length TL, only the metric sums of these paths need to be kept. It is already known that the second and third ACSDs will produce metric sums for a one and zero at bit time t, respectively. It is also known that the primary ACSD always passes the metric sums corresponding to a one at time t to the second ACSD. Similarly, the primary decoder sends the metric sums corresponding to a zero at time t to the third ACSD. Retaining path histories thus provides no additional information.

Elimination of path memory requirements is a significant complexity reduction. There are less obvious factors that make this decoder architecture even more desirable. These complexity issues will be discussed.

Now that the new decoder operation has been described, different architectures will be explored. The reason why several schemes are presented is, it is difficult to determine which one is the best. For many problems, the best solution varies depending upon the application. This issue will be addressed here by providing an evaluation of each architecture. The ones that appear most promising will be identified. An operational description for each scheme is also given.

MLP ARCHITECTURE 1

FIG. 2 shows the block diagram of the first MLPC decoder architecture. It operates exactly like the MLPC decoder described above.

The primary ACSD 3 passes the one path metric sums to the upper 1-to-N demultiplexer block 4. It also passes zero path metric sums to the lower 1-to-N demultiplexer 5.

The number $m+N$ where m is the encoder memory, equals the decoder truncation length. The number N is a variable. Based on MLD performance, $N+m$ must be 4–5 code constraint lengths for good ACSD performance. This expectation was investigated using simulation. The results are presented later (see FIG. 16).

Another item to note in FIG. 2 is, the primary ACSD 3 passes vectors of metric sums 9, 10 to the demultiplexers blocks 4, 5. The vector length sent to each demultiplexer block is $2^m$. The upper demultiplexer block 4 transfers its metric sum vector to ACSD $(1, j)$ 7 where j is between 1 and N. Similarly, the lower demultiplexer block 5 sends its metric sum vector to ACSD $(0, j)$ 8.

The value of j depends upon the input to the demultiplexer blocks 4,5 from the sequencer or counter 6.

The sequencer 6 incrementally selects j in a round-robin fashion. The value of j begins at 1 and is incremented after each new set of metric sum vectors are generated by the primary ACSD 3. After j reaches the value N, it is reset to 1. In FIG. 2, the ACSDs in the two sets are selected from top to bottom (1 through N) and then back to the top.

After ACSD $(0, j)$ 8 produces its metric sum vectors, they are sent to the lower N-to-1 multiplexer block 11.

ACSD $(1, j)$ 7 sends its metric sum vectors to the upper multiplexer block 12 at the same instant. The sequencer 6 also controls which inputs to the two multiplexers 12, 11 are chosen. The inputs selected are always the $j^{th}$ ones. While ACSD $(0, j)$ 8 and ACSD $(1, j)$ 7 send the maximum metric sum vectors to the two multiplexers, 12 13 a new set of metric sum vectors are input to them from the demultiplexer blocks 4,5. Therefore, ACSD$(0, j)$ 8 and ACSD $(1, j)$ 7 always produce a soft decision for every $N^{th}$ bit. The set of ACSD 7,8 can be thought of as a circular queue that is always full. The difference here is the ACSD 7,8 are not just storage sites for the metric sums but also do processing on them while in the queue.

Each multiplexer block 12, 11 contains a maximum metric sum select function. The purpose of this function is to choose the two maximum metric sums from each set of metric sum vectors. These two sums are then sent out from the two multiplexer blocks 12, 11 and subtracted from one another 13. The metric sum output by the upper multiplexer 12 is the one path maximum metric sum. The lower multiplexer 11 output is the zero path maximum metric sum. The difference between these two sums is the soft decision.

Placing the maximum metric sum select functions in the multiplexer blocks 11, 12 makes sense. Only two are needed if they are located there. If they are placed in the ACSDs 7,8, then 2N are required. Demultiplexers and multiplexers of conventional construction may be employed to implement blocks 4,5 and 11, 12. Circuits for determining the largest of a number of simultaneously presented signals, in this case the metric sums, are also well known and may be employed to implement blocks 11, 12.

The maximum metric sum select function 11, 12 implies $2^m-1$ compares per information symbol. This function can be eliminated. The truncation length of the MLPC decoder must be lengthened slightly to do so. Only two ACSD metric sums (ACSD $(0, j)$ and ACSD $(1,m)$) 7,8 would then be sent to the subtractor. The reason why this can be done is for sufficiently long decoding spans, all paths merge with the most likely one. It would be important that j=m(sums taken from corresponding ACSDs)7, 8 to prevent biases for ones or zeros from occurring. In this disclosure, the maximum metric sum operation will be assumed to identify the need for this function or some substitute for it.

There are disadvantages to this decoder architecture. The first can be seen when examining FIG. 2. The decoder requires two 1-to-N demultiplexer blocks 4,5. Each demultiplexer 4,5 to ACSD 7,8 connection is a vector. There are $2^m$ metric sums in each vector. Each metric sum is represented using q bits. Since there are 2N demultiplexer 4,5 to ACSD 7,8 vector connections, there are a total of $2Nq2^m$ single line connections between the two demultiplexers 4,5 and the 2N ACSDs 7,8. This is a large number for typical values of m,q and N. Not only are the connection totals a problem but the demultiplexer 4,5 itself is massive. For the two demultiplexer 4, 5 blocks, a total of $2q2^m$ 1-to-N demultiplexers are needed.

Another disadvantage in this decoder is due to the analogous situation between the ACSDs 7,8 and the two multiplexer blocks 11, 12. The number of connections is $2Np2^m$ where p is the number of bits used in each metric sum. There are $2p2^m$ N-1o-1 multiplexers needed.

The connection and multiplexer numbers can be reduced considerably by placing maximum metric sum select functions in each ACSD 4,5. The number of ACSD 4,5 to multiplexer 11, 12 connections then decrease to 2Np. The number of multiplexers needed is two N-to-1s. The disadvantage to this approach is 2N of these functions are needed as opposed to just two. There is an advantage to this though. Each select function operates 1/N times slower.

MLPC ARCHITECTURE 2

Figure 3:
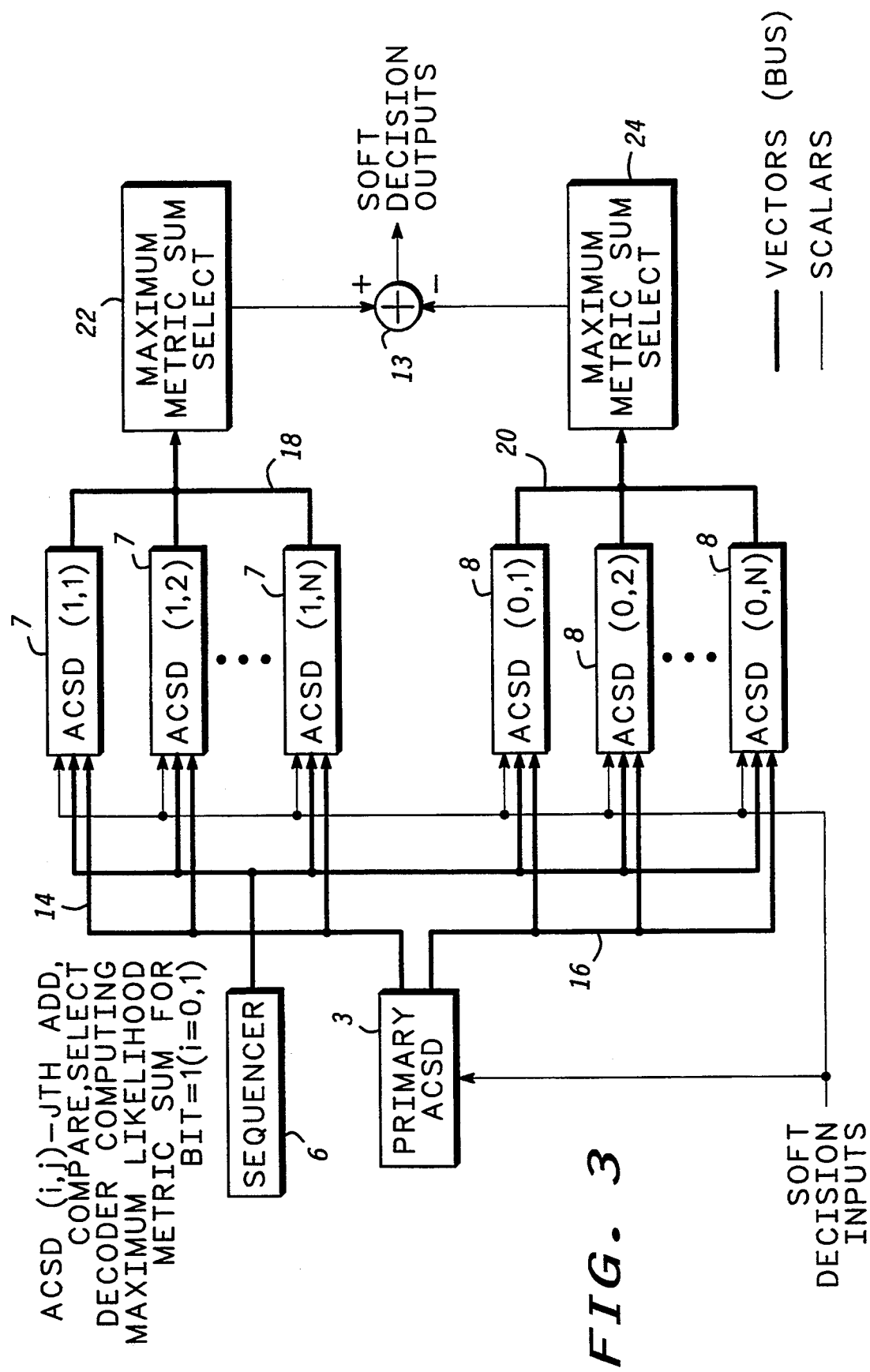
In FIG. 3, there is shown a schematic diagram of architecture 2 of the MLPC decoder invention.

The second MLPC decoder architecture appears in FIG. 3. This architecture is a variation of the one in FIG. 2. From an implementation standpoint, it improves upon the first decoder scheme. It accomplishes this by eliminating the demultiplexer and multiplexer blocks. The are replaced by buses 14, 16, 18, 20.

The primary ACSD 3 sends the two metric sum vectors sets onto two separate buses 14, 16. The top bus 14 feeds the upper N ACSDs 7 while the lower bus 16 is for the lower N ACSDs 8.

The sequencer 6 again selects the ACSDs 7,8 using a round-robin or top to bottom and back to the top method. ACSD (0,j) 8 and ACSD (1,j) 7 read the respective buses 14, 16 when chosen by the sequencer 6. ACSD (0,j) 8 inputs the zero constrained path metric vectors from the bus 16. Meanwhile, ACSD (1,j)7 reads the one constrained path metric sums. The other 2(N-1) ACSDs are off the buses 14, 16, 18, 20 (high impedance state).

After N bit times ACSD (0, j) 8 and ACSD (1,j) 7 are ready to send out the surviving metric sums. The sequencer 6 controls this function also. Rather than the outputs going to multiplexers, they are also sent to two other buses 18, 20.

The two output buses 18,20 terminate at the inputs of two maximum metric sum select blocks 22,24. Blocks 22,24 perform the same selection process as incorporated in blocks 11, 12 and may be implemented using conventional circuits well known in the art. When selected, the ACSD 7,8 send the metric sums to these blocks. Again, only one ACSD is active on each bus 14,16,118,20 at any instant in time. The select blocks 22,24 once again are used to choose the maximum metric in the metric sum vectors. The maximum metrics are then subtracted 13 from one another. Again, the difference is a measure of how close the one and zero constrained paths are to one another. This difference is the soft decision.

When the selected ACSDs 7,8 send out the surviving path metrics, a new set of path metrics are being loaded into them from the primary ACSD 3. This is identical to architecture 1. Using these new path metrics, a soft decision will be produced for a bit received N bit times after the one just generated.

MLPC ARCHITECTURE 3

Figure 4:
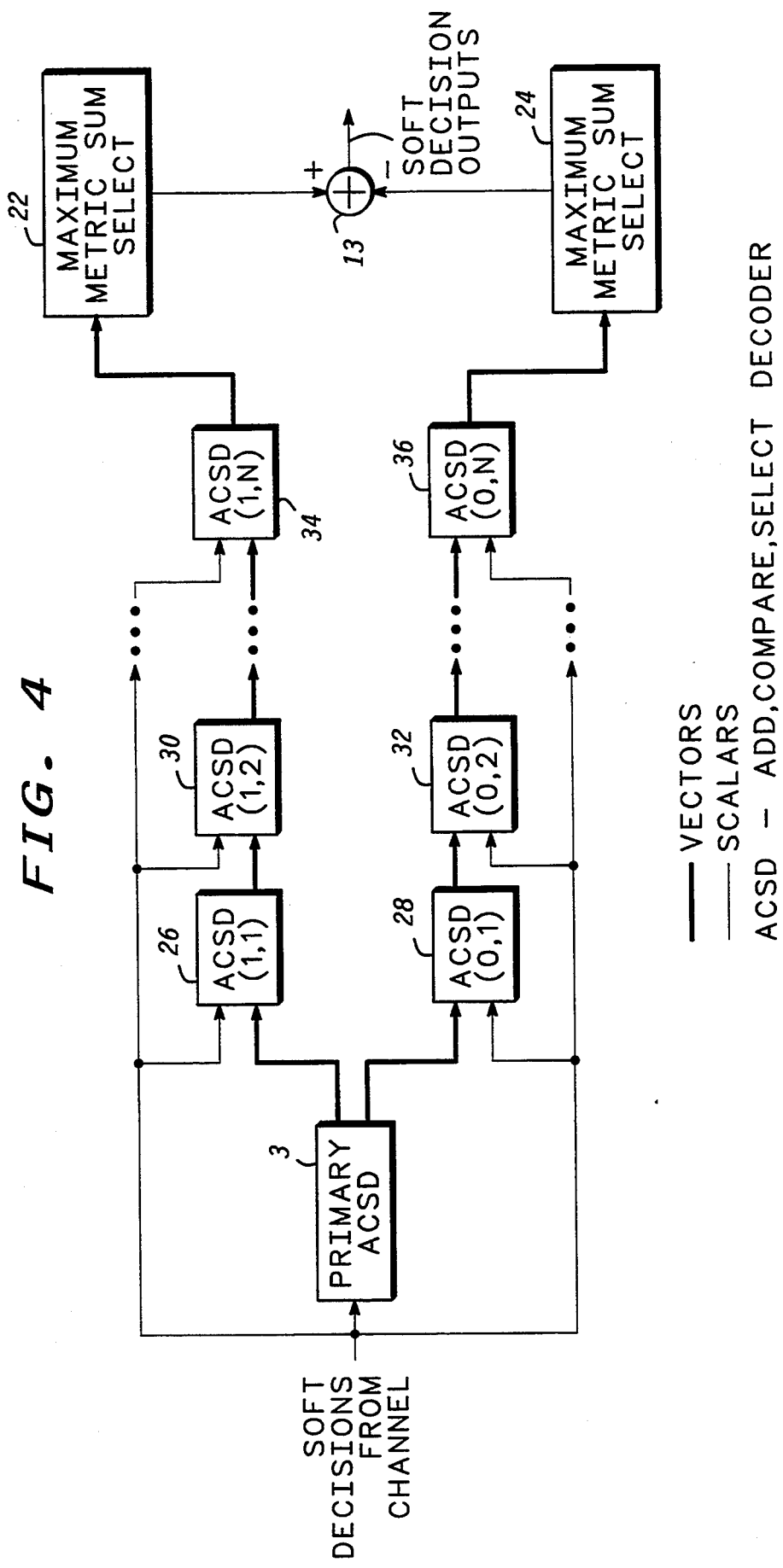
In FIG. 4, there is shown a schematic diagram of architecture 3 of the MLPC decoder invention.

FIG. 4 shows the third MLPC architecture. Using this scheme all multiplexers 11,12 demultiplexers 4,5 and buses 16, 18,20,22 are eliminated. The operation of this decoder is identical in many ways to first two schemes. The similarities include:

1. The primary ACSD 3 still produces the two surviving path metric sum vectors every source bit time as in the other two architectures.
2. The remaining ACSDs 26,28,30,32,34,36 perform the same add, compare and select operations.
3. After the decoding process is finished for each source bit, a maximum metric select function 22,24 is used to choose the zero and one constrained ML path.

There are two major differences between this architecture and the first two. The first can be seen by examining FIG. 4. In architectures 1 and 2 the primary ACSD outputs go to each of the other ACSDs 7,8. This occurs once every N outputs. The primary ACSD 3 in architecture 3 always sends the surviving metric sum vectors to the same two ACSDs i.e. ACSD (1, 1) 26 and ACSD (0, 1) 28. ACSD (1, 1) 26 receives the one constrained metric sums and ACSD(0,1)28 the zero constrained sums.

The second difference between this scheme and the first two is how long ACSD(0,j) 28,32,36 and ACSD(1,j)26,30,34 operate on the metrics of a single bit. In the first two architectures, the selected ACSDs 4,5 perform decoding operations on the metric sums of a single bit. They do so until they receive the next input N source bit times later. ACSD (0,1) 28 and ACSD (1,1) 26 update path metrics only once per source bit in this scheme. After the one update, ACSD (0,1) 28 sends its survivors to ACSD (0,2) 32. ACSD(0,1)28 receives the next set of metrics from the primary ACSD 3 at the same moment. Similarly, ACSD (1,1)26 transfers its survivors to ACSD(1,2)30 after a single update. It also simultaneously receives the next set of inputs from the primary ACSD 3.

All non-primary ACSDs 26,28,30,32,34,36 operate exactly the same way as described above for ACSD(0,1)28 and ACSD (1,1) 26. The process is the following:

1. Update the path metrics inputs once.
2. Pass the surviving metrics to the next ACSD 26,28,30,32,34,36 (the ACSD 26,28,30,32,34,36 to the right in FIG. 4).
3. While sending out the updated metrics, receive a new set of inputs from the preceding ACSD 26,28,30,32,34,36(the ACSD 26,28,30,32,34,36 to the left in FIG. 4) for updating.

Another way of stating this is ACSD(i, j) 26,28,30,32,34,36 where i=0 or 1 and j=1 .. N-1 sends its survivors to ACSD (i, j+1) 26,28,30,32,34,36 after one update operation. A special case occurs for j=N. In this situation, decoding has been completed for the bit whose surviving metrics are ready to be sent out by ACSD(0,N) 36 and ACSD(1,N) 34. These two ACSDs 34, 36 pass the metrics to the respective maximum metric sum select blocks 22,24. These blocks then choose the two maximum metric sums to be subtracted. The result of the subtraction 13 is once gain the bit level soft decision.

Decoder architecture 3 is a pipelined scheme. Moving right to left one ACSD 26,28,30,32,34,36 at a time, each contains the surviving metric sums for incrementally earlier source bit times. For example, assume that ACSD (1,j) 26,28,30,32,34,36 contain the surviving metric sums for source bit time t. ACSD(1,j+1)30,34,36,38 and ACSD(0, j+1)30,34,36,38 then contain the metric sums for source bit t-1. After each update, the surviving metrics sums are transferred (piped) to the right.

Because the ACSD 26,28,30,32,34,36 outputs in decoder architecture 3 are always piped to the same location, no demultiplexers 4,5 or buses 14,16,18,20 are needed. This scheme therefore should be more desirable from an implementation standpoint. Connection lengths and fanouts are minimized. Another slight advantage is, this decoder architecture does not require a sequencer 6 as in the first two schemes.

A detailed block diagram of a decoder with this type of architecture is shown in FIG. 5. The encoder memory size for the decoder in this figure is two. The trellis for the code is in FIG. 1. Note that all blocks labeled ACSD 3,26,28,30,32,34,36 are a single add, compare and select decoder and not an array of them as in FIG. 4. Comparing FIGS. 4 and 5, the four left-most ACSDs 3 comprise the primary ACSD 3. The upper 4×N matrix of ACSDs 26,30,34 correspond to the upper N ACSDs 26,30,34 while the lower 4×N matrix 28,32,36 are the lower N ACSDs 28,32,36.

Some details are omitted from the decoder block diagram in FIG. 5 due to the lack of space. The omissions are:

1. Interconnection of the primary ACSDs 3 to one another.
2. Primary ACSD 3 block contents.
3. Details of the interconnections (interconnection blocks)38 between the nonprimary ACSDs 26,28,30,32,34,36.
4. Nonprimary ACSD 26,28,30,32,34,36 block contents.

Figure 7:
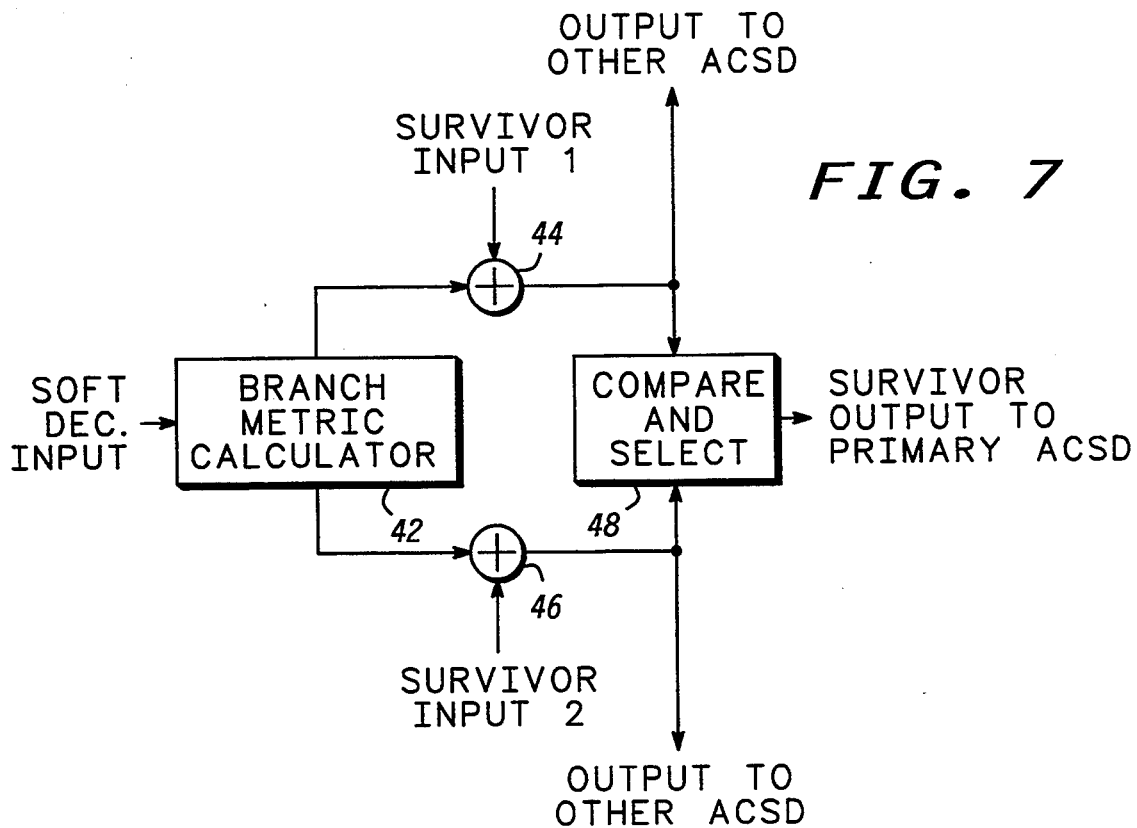
In FIG. 7, there is shown a detailed schematic of the ACSD block contents for ACSDs 0, 12 and 3 shown in FIG. 5.
Figure 8:
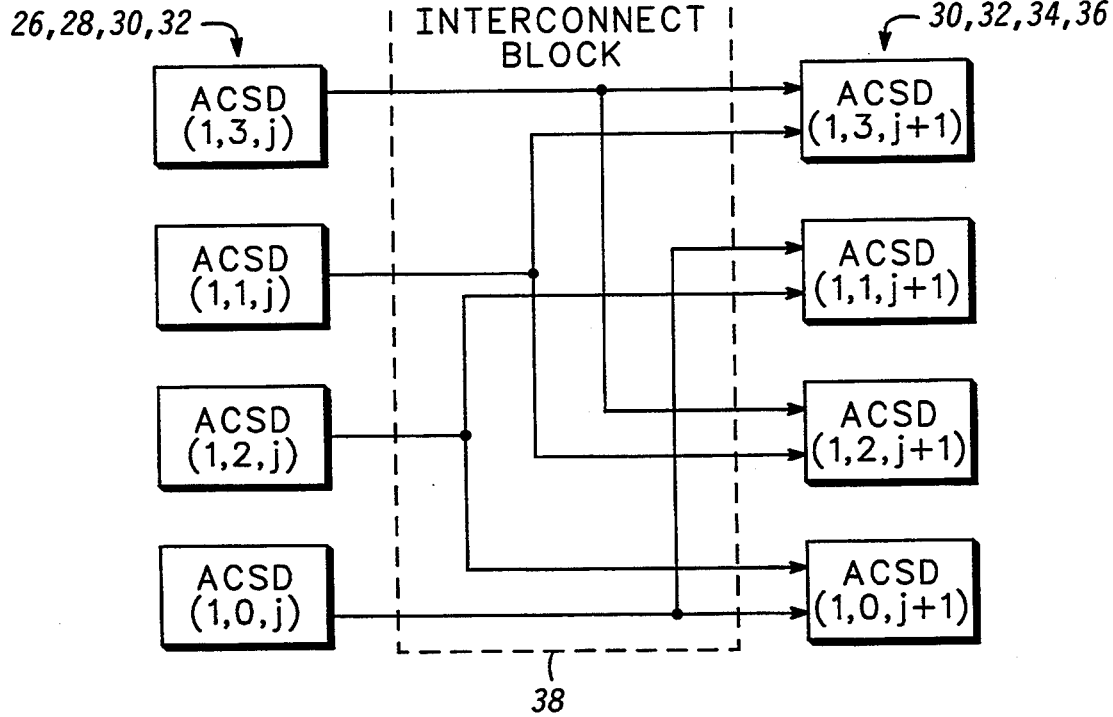
In FIG. 8, there is shown a detailed schematic of the ACSD interconnections for all ACSDs (except 0, 1, 2 and 3) shown in FIG. 5.

These details will now be addressed starting with the first, the primary ACSDs 3 interconnections. These connections are shown in FIG. 6. The interconnections are identical to those of a regular MLD and mirror the trellis connections in FIG. 1. Also shown in FIG. 6 are eight unconnected ACSD outputs 40 (two per ACSD block). These outputs are where the constrained path metrics are passed to the nonprimary ACSDs (i,j,1)26,28,30,32,34,36 where i=0 or and j=0..3. These connections appear in FIG. 5. The contents a primary ACSD block is the next aspect of FIG. 5 expanded upon. A block diagram of a primary ACSD 3 appears in FIG. 7. Branch metric calculator 42 and compare and select 48 are individually well known in the art and used in Viterbi decoders. This figure shows the survivor metric sum and soft decision inputs. Branch metrics 42 are computed for and added 44,46 to each surviving metric. The sums from these two add operations 44,46 are the outputs transferred to the nonprimary ACSDs 26,28. The adder outputs also go to the compare and select block 48 where the largest metric of the two is chosen. The output from this operation becomes the new survivor input to two of the four primary ACSDs 3. The third detail to fill in for FIG. 5 is the interconnection blocks 38 between the nonprimary ACSDs 26,28,30,32,34,36. FIG. 8 provides this detail. Now it is convenient to compare FIGS. 1 and 8. The comparison is performed by looking at the trellis connections during bit time t in FIG. 1. If ACSD(x,i,x)26,28,30,32,34,36 in FIG. 8 (where x is any allowed value) is considered state $S_i$ in the trellis 0 then the ACSD interconnections 38 are identical to the trellis interconnections 1,2. This means that the upper and the lower 4×N matrices of nonprimary ACSDs 26,28,30,32,34,36 of FIG. 5 are two separate but identical trellis structures.

Figure 9:
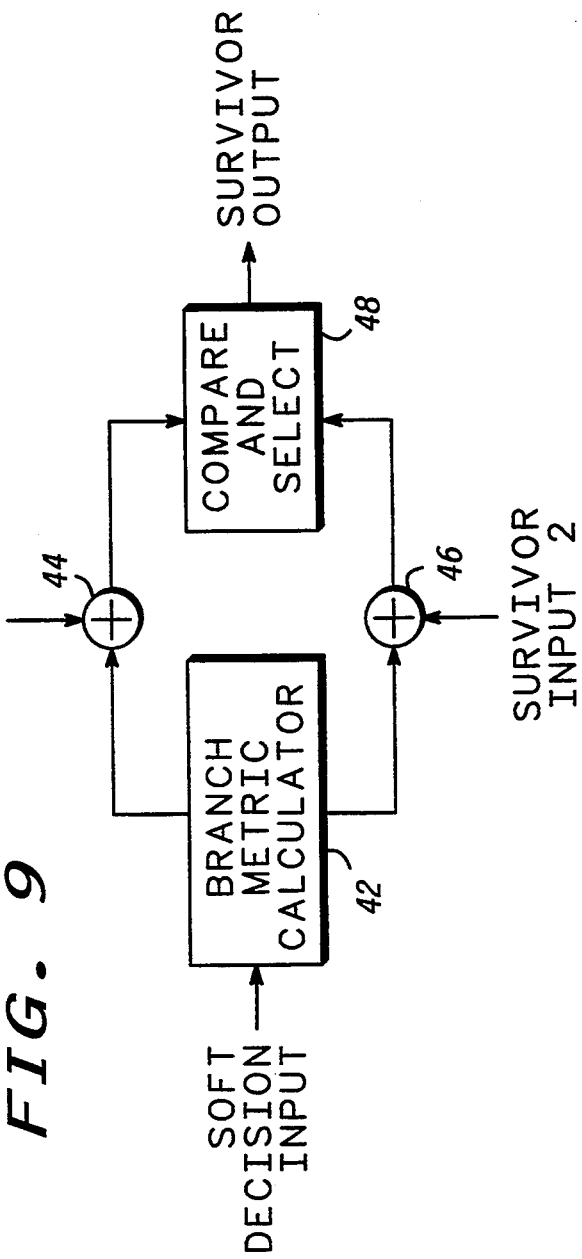
In FIG. 9, there is shown a detailed schematic of the ACSD block contents for all ACSDs (except 0,1, 2 and 3) shown in FIG. 5.

A block diagram of a nonprimary ACSD 26,28,30,32,34,36 is shown in FIG. 9. Component wise, it is no different than the primary ACSD 3 in FIG. 7. The only difference between the two is, the adder outputs in the nonprimary ACSDs 26,28,30,32,34,36 are not sent to other ACSDs 26,28,30,32,34,36.

Note that most nonprimary ACSDs 26,28,30,32,34,36 receive two inputs from two other ACSDs 26,28,30,32,34,36. An exception to this occurs for the ACSDs 26,28,30,32,34,36 fed by the primary ACSDs 3. These ACSDs 3 receive only one input. The other input is zero. This is shown in FIG. 5. Also, the branch metric calculation block 42 for the ACSD, shown in FIG. 9, inputs a zero to the adder for this zeroed input. The metric sums from the primary ACSDs 3 are all positive and thus, this sum plus the branch metric is always greater than zero. Since the first ACSDs (ACSD (i,j,1) 26, 28 where i=0 or 1 and j=0..3) receive one survivor input only, all of them need to survive the ACSD operations. Placing zeros on the other input ports and zeroing all of the branch metrics guarantees survival of the desired input.

MLPC ARCHITECTURE 4

Implementation issues indicate that decoder architecture 3 should be the best one introduced so far. It has a complexity disadvantage like the others though from the total number of ACSDs 3,26,28,30,32,34,36 needed. Decoder schemes that reduce ACSD counts are possible. The downside of this reduction is an increase in decoding delay. If an architecture introduces a relatively small delay while significantly reducing the ACSD count then it should be more desirable than the one in FIG. 4. This is the goal for architecture 4.

Figure 10:
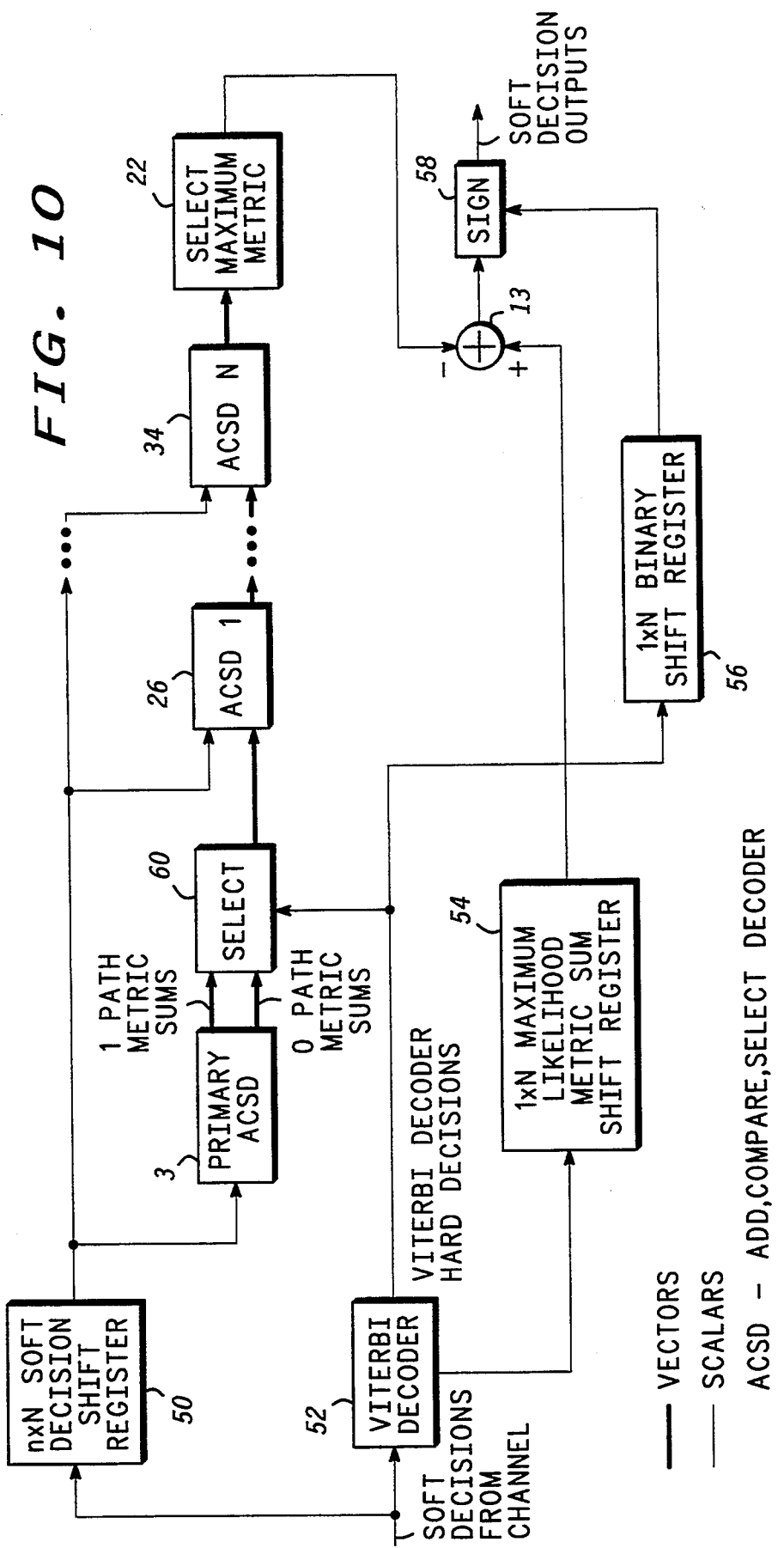
In FIG. 10, there is shown a schematic diagram of architecture 4 of the MLPC decoder invention.

Decoder architecture 4 appears in FIG. 10. This decoder is a variation of architecture 3. Compared to architecture 3, it reduces processing hardware at the cost of increased decoding delay. The major architectural differences between schemes 3 and 4 include:

1. The total nonprimary ACSD 26,30,34 count in architecture 4 is only N. This is one half the amount needed in architecture 3.
2. Architecture 4 contains a Viterbi decoder 52.
3. A mux 60 sends either zero or one constrained paths from the primary ACSD 3 into the single ACSD array 26,34.
4. Relatively small memories are needed to delay the input soft decisions in register 50 along with the maximum metric sums in register 54 and hard decisions in register 56 from the Viterbi decoder 52.

Register 50 has n×N stages each stage holding multiple bits according to the number of bits in the soft decision from the channel, for example, typically 3 bits.

n is the number of bits coming from the encoder per data input bit and N is the delay in encoder input bits through the Viterbi decoder before it outputs a decision.

The Viterbi decoder 52 performs the key operation that allows the elimination of N ACSDs 28,32,36. A description of how the decoder works and why using a Viterbi decoder 52 halves the ACSD count is given next.

Recall from architecture 3 discussions that moving right to left, the path metric sums contained in the ACSD 26,28,30,32,34,36 are for incrementally later bit times. It is typically assumed that probability of transmitting a 0 or a 1 is 0.5. With this assumption, the unconstrained maximum metric sum is on average in ACSD(0, j) 28,32,36 one half of the time. The integer j is between 1 and N and indicates where the sum is in the decoder. The other half of the time the maximum sum is in ACSD(1,j)26,30,34. It is not known which ACSD 26,28,32,34,36 array contains the maximum sum until the decoding process completes for the bit. The maximum unconstrained metric sum is therefore randomly distributed between ACSD (0,j) 28,32,36 and ACSD (1,j) 26,30,34.

A Viterbi decoder 52 produces a sequence of bits representing the maximum likelihood path through the code trellis. The state of each bit provides essential information for the new decoder. The bit state indicates which ACSD (if bit=0 then ACSD (0,j) 28,32,36 otherwise ACSD (1,j) 26,30,34 contained the maximum unconstrained metric sum.

The primary ACSD 3 in FIG. 10 operates exactly like the one in architecture 3. Ignoring the updating and retention of survivor paths, the ACSD 3 performs the same calculations that the Viterbi 52 decoder does. The significant difference between the two is the primary ACSD 3 is delayed by N information 50 bits relative to the Viterbi decoder 52. This delay is implemented by placing a soft decision shift register 50 before the primary ACSD 3. The importance of this delay is discussed below.

The path memory length of the Viterbi decoder 52 is forced to be N+m. With this constraint, the following two events happen at the same instant:

1. Hard decisions for bit j are generated by the Viterbi decoder 52;
2. The primary ACSD 3 compares for the first time the zero and one constrained paths for bit j.

At this point in architecture 3, both sets of constrained path metrics are sent to separate ACSD 26,28,30,32,34,36 arrays to retain both zero and one paths metrics. Only one set needs to be kept in this scheme. The Viterbi decoder 52 has already found the ML path metric sum and the hard decision. this is the output of one of the two ACSD 34,36 arrays. The only remaining piece of information needed is the metric sum from the other ACSD array.

The metric sum that is not the ML sum is obtained as follows:

1. Hard decisions from the Viterbi decoder 52 control the select block 60 in FIG. 10. One of the two surviving metric sums from the primary ACSD 3 is chosen to output ACSD 1 26; If the hard decision is one then the zero constrained metric sums are selected. The one constrained metric sums are output to ACSD 1 26 for a zero hard decision.
2. ACSDs 1 26 through N 34 operate exactly as they do in architecture 3. They receive soft decisions delayed by N bits like the primary ACSD 3 does. The maximum metric sum is obtained from ACSD N 34 by the select maximum metric block 22. This is the other metric sum needed to calculate a soft decision.

The select maximum metric block 22 in FIG. 10 is synchronized with the maximum likelihood metric sum shift register 54. Both produce metric sums for the same bit at the same instant. The ACSD array sum is subtracted 13 from the ML sum. The result of this subtraction is always zero or positive.

In architectures 1 through 3, a positive soft decision implies that the bit is most likely a one. A negative soft decision means a zero was most likely. For consistency, this convention is followed for architecture 4. The sign block 58 at the subtractor 13 output thus forces the soft decision sign to be negative when the Viterbi decoder 52 hard decision is a zero. To synchronize the soft decision sign selection, a delay of N bits is required. The delay is placed between the Viterbi decoder 52 output and the sign block 58. The N bit shift register 56 in FIG. 10 implements this delay.

Architecture 4 reduces complexity significantly and increases decoding delay slightly. The requirements of the decoder include a Viterbi decoder 52 and three length N shift registers 50,54,56. These shift registers 50,54,56 delay the channel soft decisions and the Viterbi decoder 52 ML sum and hard decision outputs. This decoder saves N ACSDs 28,32,36 versus architecture 3 by strategic use of the Viterbi decoder 52 and shift registers 50,54,56. The decoder complexity is estimated to be about half that of architecture 3. Decoding delay increases by only N bits. In applications where delay is not critical, architecture 4 is better than 3.

Note that architectures 1 and 2 could also benefit from complexity reduction by using the techniques presented in this section. They would also suffer an added N bit decoding delay. Such modifications to architectures 1 and 2 will not be presented though. The reason why is, architecture 4 is still more desirable than these modified architectures.

MLPC Architecture 5

Figure 11:
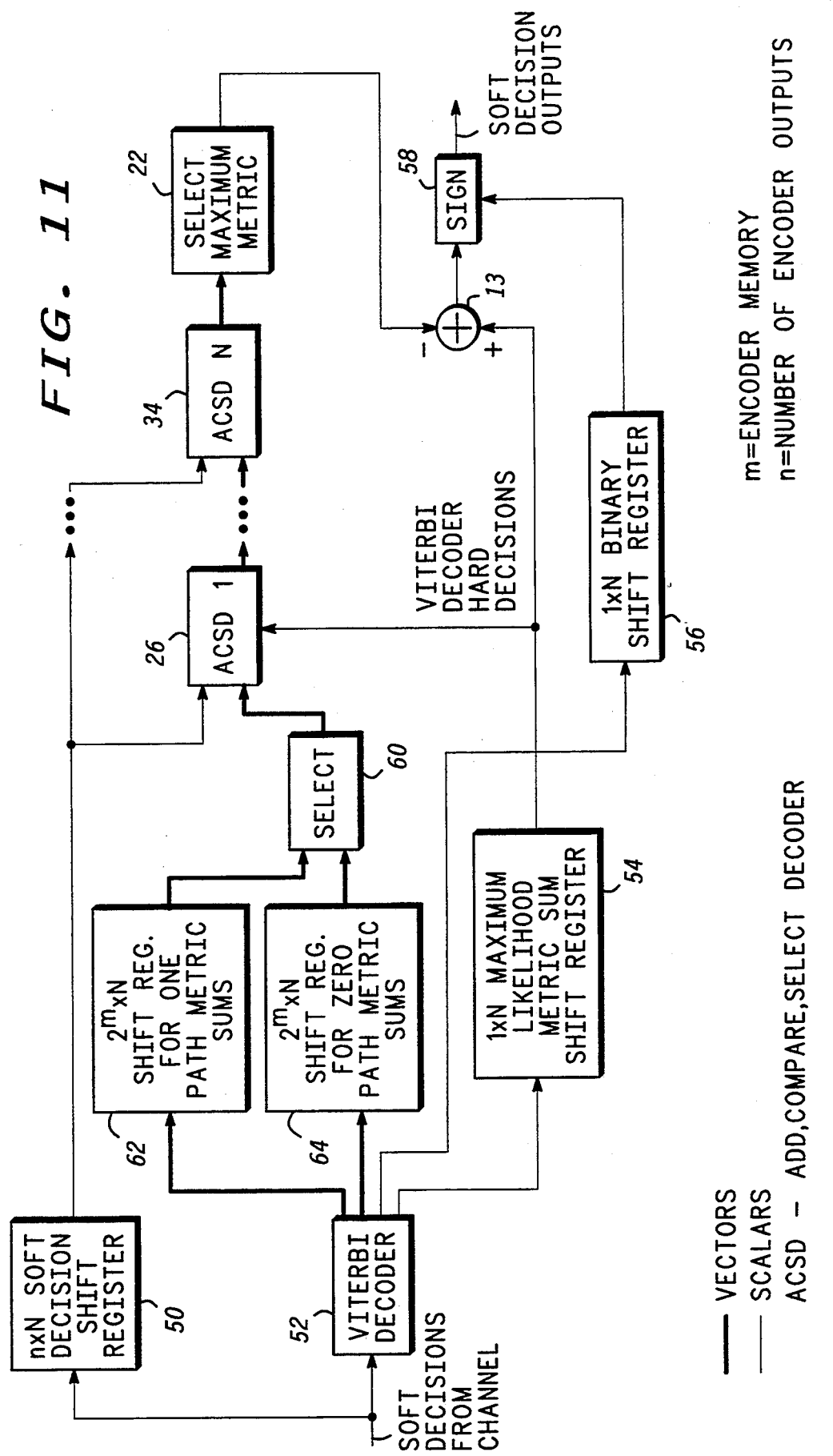
In FIG. 11, there is shown a schematic diagram of architecture 5 of the MLPC decoder invention.

Decoder architecture 4 can be modified to eliminate the primary ACSD 3. To do this requires a significant amount of memory 62,64. FIG. 11 shows the block diagram for this scheme called architecture 5. the Viterbi decoder 52 is modified to generate the same $2 \cdot 2^m$ surviving metric sums the primary ACSD 3 in FIG. 4 does. Instead of immediately sending these sums to two different ACSD 26,28 arrays they are stored in two separate memory sites 62,64. One memory unit 62 receives the sums that go to the upper ACSDs 26 in architecture 3. The other memory site 64 gets the sums that go to the lower ACSDs 28. The two memories 62,64 provide an N bit delay. This is the same delay needed in architecture 4 but generated there by delaying the channel soft decisions to the primary ACSD 3. The metric sum produced by ACSD N 34 is calculated from the stored metric vectors.

As in architecture 4, only one of the two sets of path metrics is sent to ACSD 1 (reference number 26) in this decoder. The set is selected in the same manner i.e. by the hard decision output from the Viterbi decoder 52. The rest of the decoder is identical to architecture 4.

It was stated above that architecture 5 eliminates processing hardware (primary ACSD 3) at the cost of a large increase in memory 62,64. This scheme should be less desirable than architecture 4 though. The reason for this is due to implementation issues. Today, this new decoder would be implemented in an application specific integrated circuit (ASIC). Placing memory inside of ASICs is very inefficient. The primary ACSD 3 would use less logic gates in the ASIC and thus architecture 4 is preferred over 5.

MLPC ARCHITECTURE 6

Figure 12:
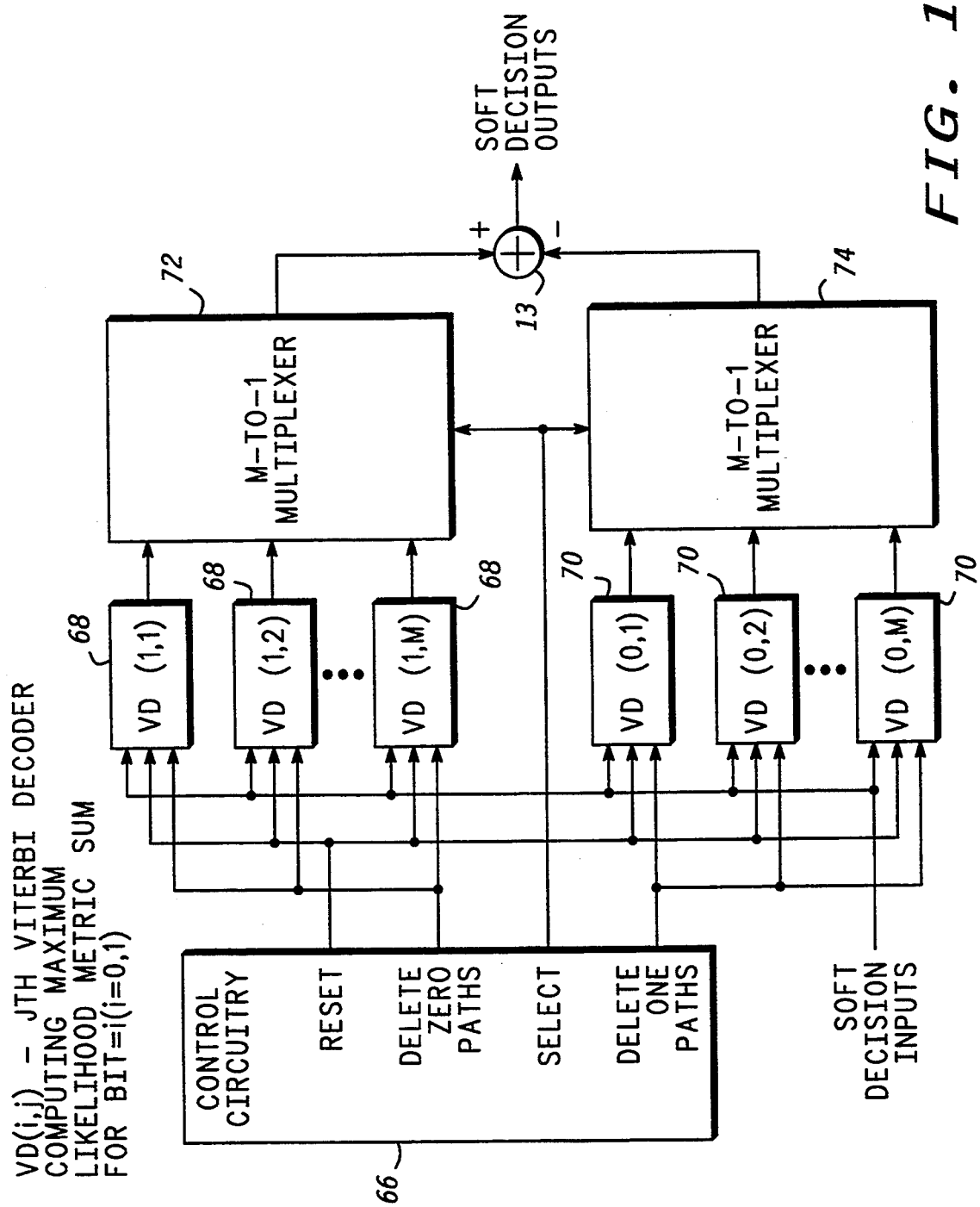
In FIG. 12, there is shown a schematic diagram of architecture 6 of the MLPC decoder invention.

Architecture 6 uses a set of decoders 68,70 that must resynchronize themselves for each bit decoded. FIG. 12 shows this decoder architecture. This decoder uses Viterbi decoders 68,70 and no ACSDs. These Viterbi decoders 68,70 do have slight modifications versus normal Viterbi 52 decoders though. The changes include:

1. When commanded by control circuitry 66 these decoders 68,70 will delete trellis branches with an encoder input of either a zero or one. The zero or one path deletions occur at the instant the delete path command arrives. Block 66 contains a counter which sequentially activates decoder 68 and decoder 70.
2. The Viterbi decoders 68,70 generate the maximum metric sum for each bit.

The upper M Viterbi decoders 68 find the maximum metric sum for one constrained paths. The lower M decoders 70 find the zero constrained maximum metrics.

This scheme resembles architecture 1 in that the upper 7,68 and the lower 8,70 decoders are reset and send out the maximum sums using a round-robin method. The M-to-1 multiplexer blocks 72,74 serve that same purpose as the ones in architecture 1 also. They route the maximum metric sums from the selected decoders 68,70 to the subtractor 13. The soft decision then results. Note, the multiplexers 72,74 could be replaced by buses 14,16,18,20 like they were in architecture 2.

This scheme is more complex than any presented so far. It does have an advantage though. With a few changes to present Viterbi decoders 52, this scheme could be readily implemented. This in contrast to the other architectures which would require completely new integrated circuit designs. In low volume applications, this architecture would be the most cost effective one.

RESULTS

A new decoder named a MLPC decoder has been described. This decoder conveniently functions as the inner decoder in a concatenated convolutional code system. The MLPC decoder produces soft decisions that are utilized by the outer decoder. The first purpose of this subsection is to determine the MLPC decoder path truncation length. The second task is to find a good size for the interleaver used in the system. The goal is to minimize both while still obtaining good code performance. Simulation is used to investigate these two issues. The second purpose of this section is to present simulated bit error results of some concatenated codes with different outer code rates. The simulated results are then compared to the bit error rate upper bound which is an analytical result. The last purpose of this section is to compare a concatenated code hardware implementation complexity to that of a single convolutional code with the same performance.

ANALYTICAL AND SIMULATION RESULTS

Figure 13:
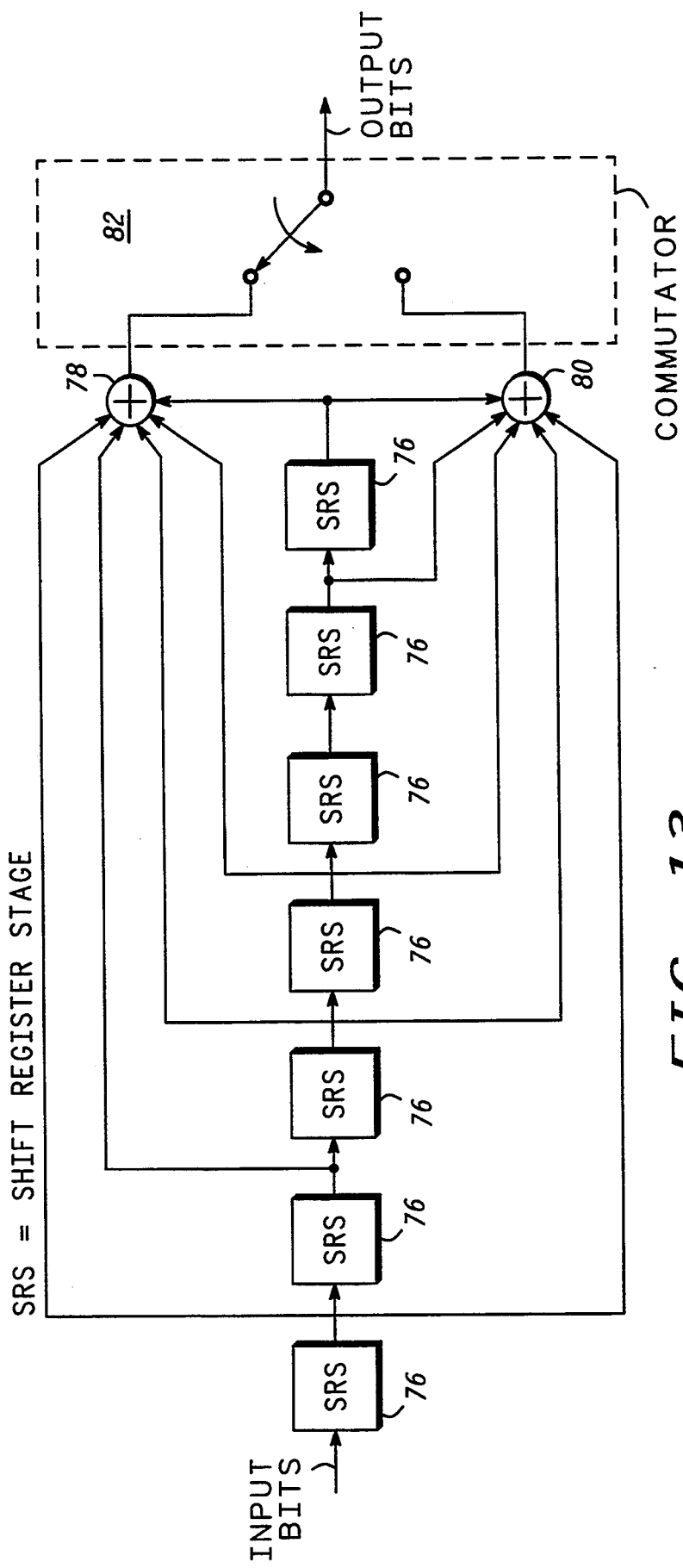
In FIG. 13, there is shown a schematic diagram of the convolutional encoder used during simulation experiments to test the decoder invention.

Before analytical and simulation studies began, codes were chosen for the inner and outer codes. Because code puncturing was utilized, there were many choices for rate and constraint length of the base inner and outer codes. The values selected were rate=$\frac{1}{2}$ and K=7. The reason for this choice was, it is a code that enjoys widespread use. The code is the optimum K=7 code and is also known as the Odenwalter code. A block diagram of the encoder for the code is shown in FIG. 13. Blocks 76 are shift register stages and 78 and 80 are modulo 2 adders. Block 82 is a commutator. Another decision made was not to puncture the inner code. This decision limited the number of simulations. All concatenated codes simulated used the unpunctured rate $\frac{1}{2}$, K=7 code as the inner code. The outer codes studied were all punctured. The bit error rate upper bound calculations in this section can also be applied to a punctured inner code.

Figure 14:
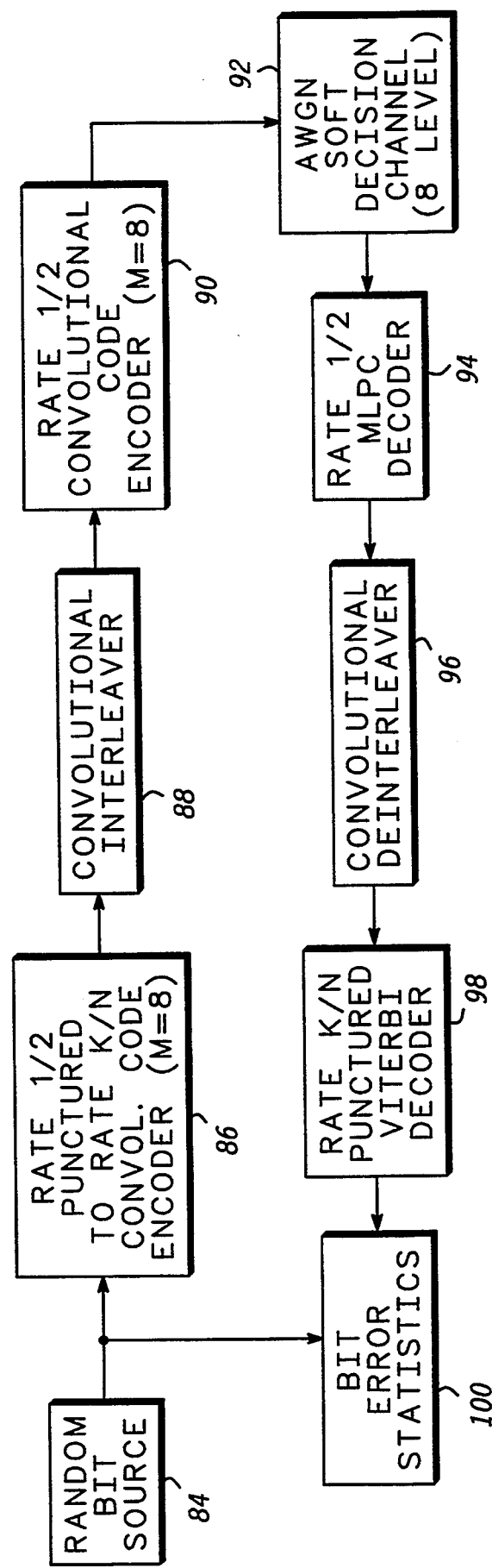
In FIG. 14, there is shown a schematic diagram of the entire communication link used during simulation experiments to test the decoder invention.

Extensive simulations were performed on the class of concatenated convolutional codes discussed above. A block diagram of the simulation structure appears in FIG. 14. The inner decoder 94 used was the new MLPC decoder described in Architecture 3. Blocks 84,86,88,90,92 96,98 and 100 are correctional. The outer decoder 98 was a Viterbi decoder. A variety of issues were investigated in these simulations, they are:

1. Interleaving degree 88,96 versus performance.
2. Inner MLPC decoder 94 truncation length versus code performance.
3. Soft decision versus hard decision performance for the outer decoder 98.
4. Bit error rate upper bound versus simulation results.
5. Histograms of inner decoder outputs versus signal-to-noise ratio.
6. Performance comparison of three outer code rates 86.

These results are presented below in this order.

The first parameter investigated was the interleaver 88 size versus bit error rate performance. The only type of interleaver 88 used in these simulations was convolutional. To reduce the scope of the work only (B,N)), where B=N, convolutional interleavers 88 were used. In a real system, B would be as small as the code performance allows to minimize the synchronization time. Since synchronization time was not an issue here, M was set to one and therefore B=N. Before the interleaver 88 size was investigated, an appropriate path truncation length had to be selected for the MLPC decoder 94. The length needed to be just long enough to yield good performance. Previous work has shown that a truncation length of 4–5 constraint lengths (for an unpunctured code) provides near optimum performance. This length was therefore selected. Intuitively, this makes sense. A MLPC decoder 94 is in essence a collection of Viterbi decoder 52 pairs. One Viterbi decoder 52 finds the one constrained ML path while the other one finds the zero constrained ML path. After 4–5 code constraint lengths, the likelihood is high that all competing paths have been eliminated and only two paths remain.

The details of the system simulated to investigate the interleaver 88 size versus code performance are:

1. Outer code: optimum rate $\frac{1}{2}$, K=7 punctured to rate 7/8 86.
2. Outer decoder: Viterbi 52 with a path truncation length of 100 98.
3. Outer code: optimum rate TM, K=7 90.
4. Inner decoder: architecture 3 MLPC with a truncation length of 38(N=32 in FIG. 1) 94.
5. Eight-level soft decision AWGN channel with demodulator thresholds set to $0.5O_n$ where $O_n$ is the standard deviation of the noise 92.
6. (B,b) convolutional interleaver 88.
7. Number of bits simulated was 30 to over 100 times the inverse of the bit error rate (greater than 95% confidence interval).
8. Inner decoder 94 soft decision output passed to the deinterleaver 96 without further quantization beyond that of the channel. Range of values from −64 to +64 in steps of 1.

Figure 15:
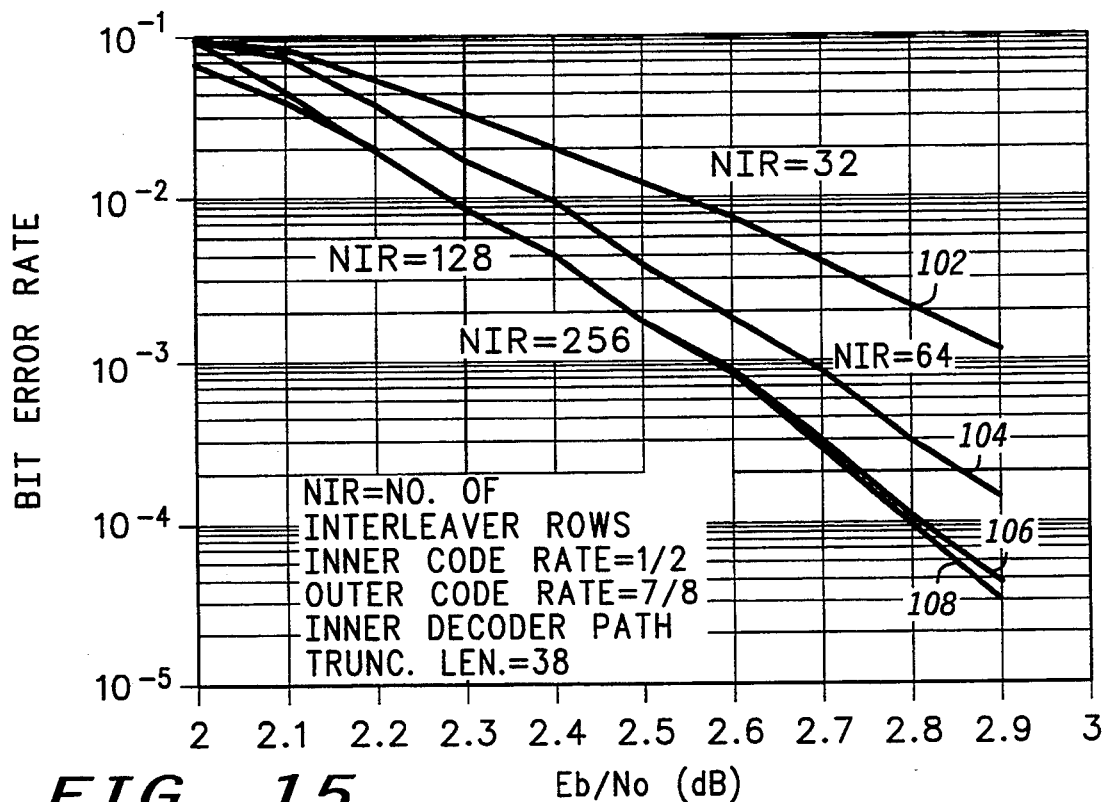
In FIG. 15, there is shown a plot of the simulated bit error rate (BER) performance versus bit energy/noise density ratio (Eb/No) for four different interleaver row lengths for the communication link shown in FIG. 14.

FIG. 15 is a plot showing the simulated bit error rate performance of the code 86,90 versus the number of interleaver 88 rows (B). The range of $E_b/N$ values simulated was from 2.0 to 2.9 dB. Four values of B were evaluated: 32 (curve 102), 64 (curve 104), 128 (curve 106) and 356 (curve 108). The graph shows improved performance for increasing values of B. This was expected. As the number of interleaver rows 88 increase, the distance between the bits in an error burst from the MLPC decoder 94 grows. Therefore, the errors appear more random to the outer decoder 98. The outer decoder 98 makes fewer decoding mistakes when the input errors are random.

FIG. 15 shows there is an increase in code performance of about 0.3 dB (at a $10^{-3}$ bit error rate) when B is increased from 32 102 to 64 104. Another 0.1–0.2 dB is obtained by increasing B from 64 104 to 128 106. Increasing B to 256 (curve 104) provides a very small improvement. The value of B used should be only large enough to provide near optimum performance. Therefore, of the four values simulated, B=128 (curve 106) is the best choice. This value was used in the other simulations for this code (rates ½ and 7/8).

Figure 16:
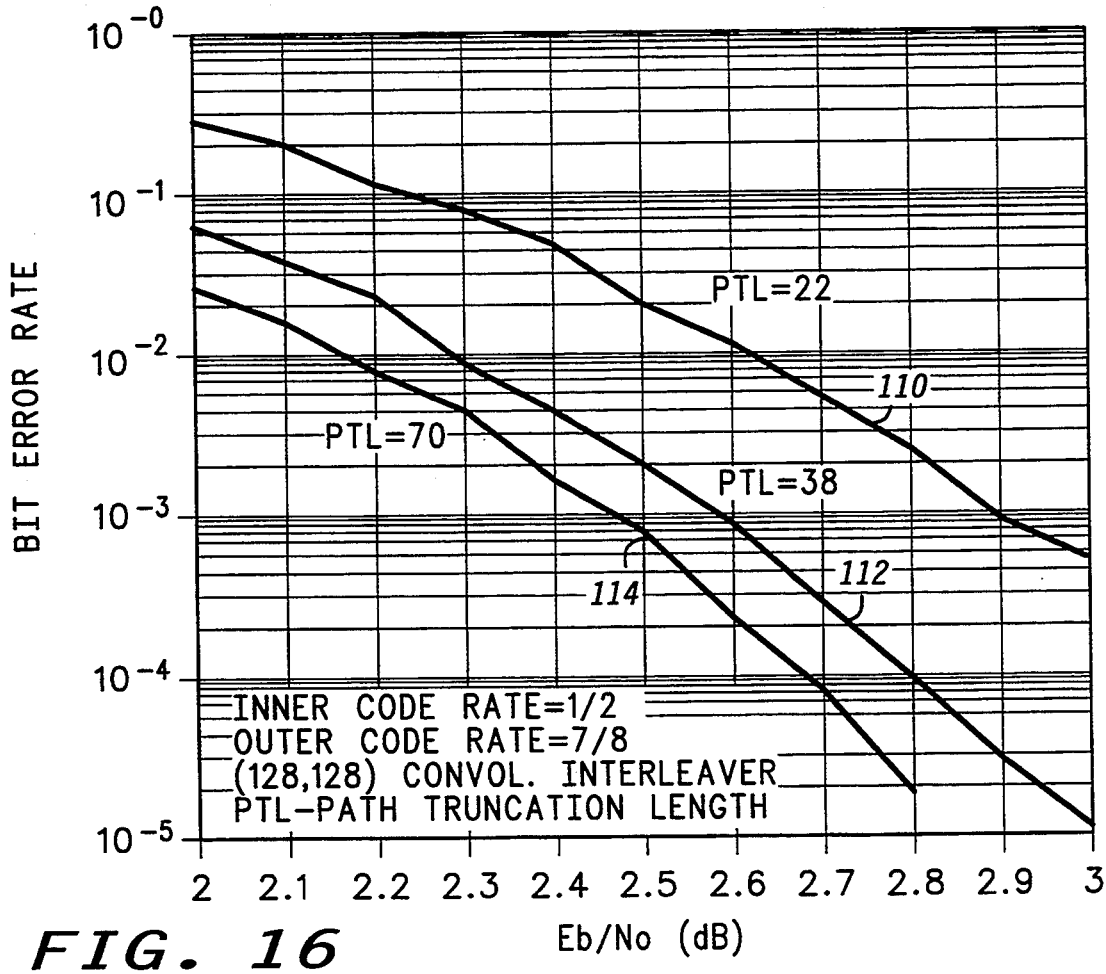
In FIG. 16, there is shown a plot of the simulated bit error rate performance versus bit energy/noise density ratio (Eb/No) for three different decoder path truncation lengths for the communication link shown in FIG. 14.

The next parameter investigated for the rates ½ and 7/8 concatenated code was the inner decoder 94 truncation length. The argument presented above concerning what this length should be (4–5 constraint lengths) makes sense. This assumption was verified using simulation. FIG. 16 contains a plot of the simulation results. The graph shows that when the truncation length is increased from 22 (curve 110) to 38 (curve 112) the gain is 0.3–0.4 dB. Increasing the truncation length from 38 112 to 70 (curve 114) provided a gain of only 0.1 dB. These results demonstrate that the initial assumption of 4–5 constraint lengths, for the truncation length was correct.

Figure 17:
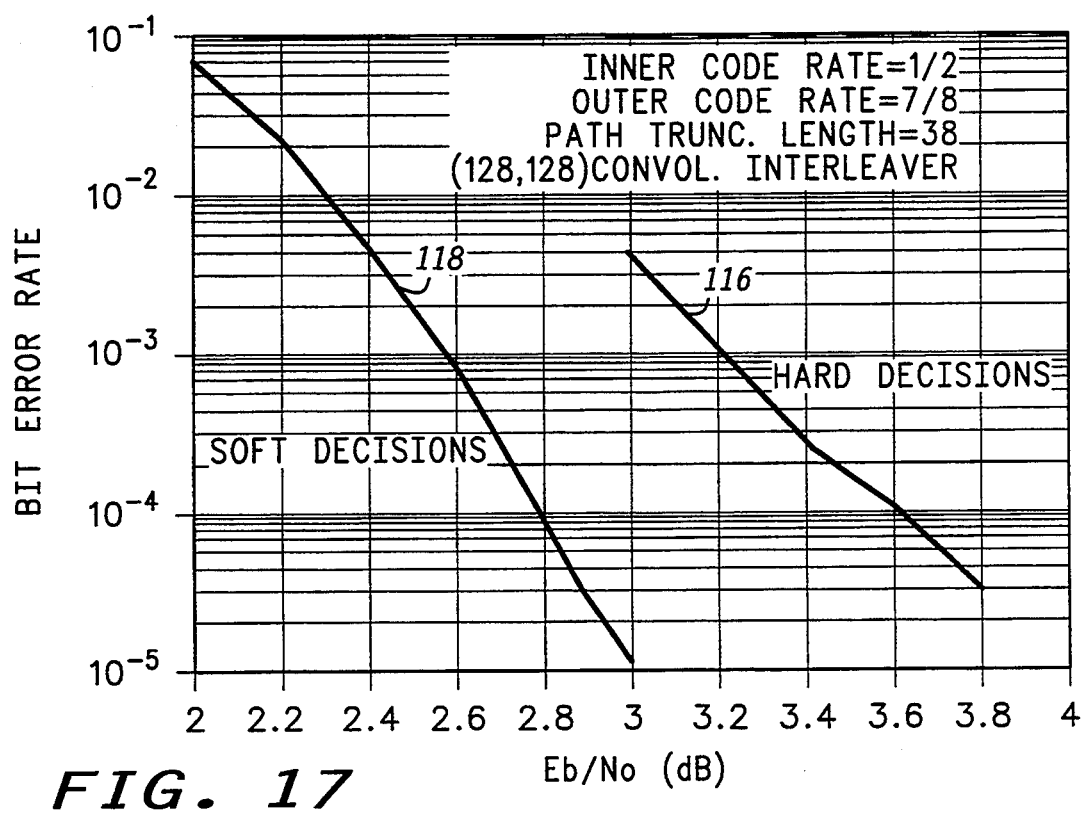
In FIG. 17, there is shown a plot of the simulated bit error rate performance versus bit energy/noise density ratio (Eb/No) for hard and soft decisions from the inner decoder to the outer decoder for the communication link shown in FIG. 14.

Another issue of interest is, how much gain is obtained (over hard decisions) when soft decisions are generated by the inner decoder 94 and utilized by the outer decoder 98. FIG. 17 contains simulated data for both the hard 116 and soft decision 118 cases. With B=128 for the interleaver 88 and an inner decoder 94 truncation length of 38, the gain is about 1 dB at a bit error rate of $10^{-5}$. The gain should grow as the $E_b/N_o$ ratio increases. Note that this increase in performance is very significant. The bit error rate is over two orders of magnitude lower at $E_b/N_o=3$ dB for soft decisions.

It is of interest to compare the calculated bit error rate upper bound to the simulation results. The bit error rate upper bound for a convolutional code used with an unquantized AWGN channel with a bilateral noise density $N_o/2$ and coherent PSK modulation is given by:

$$P_B \leq \sum_{j=d_{freeo}}^{\infty} b_j \frac{1}{\sqrt{\pi}} \int_{\sqrt{\frac{jRE_b}{N_o}}}^{\infty} e^{-x^2} dx \quad (8)$$

where $d_{free}$ is the minimum distance of the code between encoded sequences or the free distance of the code ($d_{free}$). The other variables in the equation are R and $b_j$. R represents the code rate while $b_j$ is the total number of bit errors in all code word sequence adversaries of Hamming weight j.

Applying equation (8) to the inner code, the bit error rate upper bound is:

$$P_{BI} \leq \sum_{j=d_{freeI}}^{\infty} b_j \frac{1}{\sqrt{\pi}} \int_{\sqrt{\frac{jR_IR_oE_b}{N_o}}}^{\infty} e^{-x^2} dx \quad (9)$$

where $d_{freeI}$ is the free distance of the inner code 90, $R_I$ is the inner code 90 rate and $R_O$ is the outer code rate 86.

The bit errors out of the inner decoder 94 are bursty. The deinterleaver 96 separates these bursts. The assumption is made here that the deinterleaver 96 distributes the errors over such a wide range that they are essentially random. The inner decoder 94 and deinterleaver 96 therefore present to the outer decoder 98 a random error channel with the probability of error equal to $P_{BI}$. An effective signal-to-noise ratio, $E_{be}/N_{oe}$, can be associated with this channel by:

$$P_{BI} = \frac{1}{\sqrt{\pi}} \int_{\sqrt{\frac{E_{be}}{N_{oe}}}}^{\infty} e^{-x^2} dx \quad (10)$$

If $E_{be}/N_{oe}$ is found then this effective signal-to-noise ratio can be used to find the error rate out of the outer decoder 98. The equation is:

$$P_{Bo} \leq \sum_{j=d_{freeo}}^{\infty} b_j \frac{1}{\sqrt{\pi}} \int_{\sqrt{\frac{jR_oE_{be}}{N_{oe}}}}^{\infty} e^{-x^2} dx \quad (11)$$

where $d_{freeo}$ is the free distance of the outer code 86 and $R_o$ is the outer code 86 rate.

Figure 18:
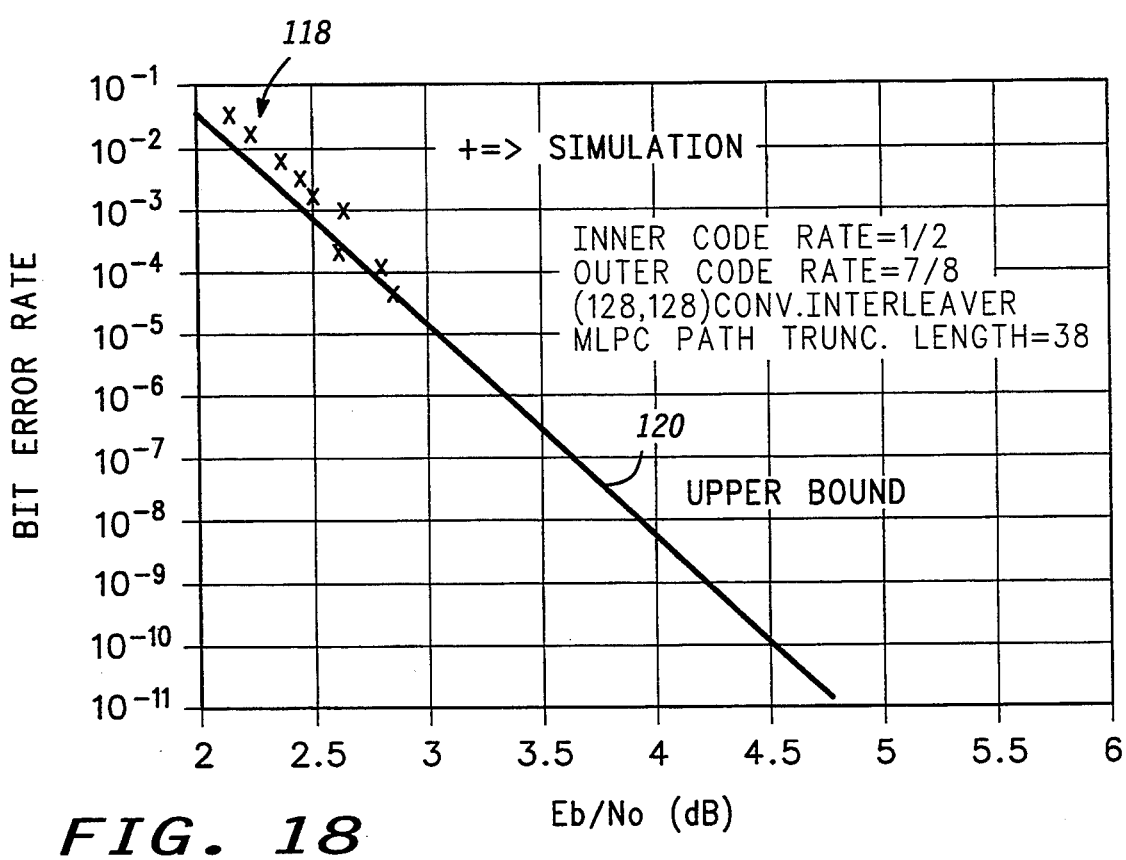
In FIG. 18, there is shown a plot of the simulated and analytical bit error rate performance versus bit energy/noise density ratio (Eb/No) for the communication link shown in FIG. 14.

FIG. 18 shows a plot of equation 120 (11) for the inner 90 and outer code 86 rates of ½ and 7/8. Note that only the first three terms were used in equations (9) and (11) to calculate this bit error rate upper bound 120. This is reasonable since the lower order terms in these two equations dominate the probability of bit error value. For he inner rate ½ code 90, the first three values for $b_j$ and j are (36, 211 and 1404) and (10, 12 and 14) respectively. For the outer punctured rate 7/8 code 86, the first three values for $b_j$ and j are (9,500 and 7437) and (3,4 and 5), respectively.

FIG. 18 also contains the previously displayed simulated data 118 for this code (FIG. 17 soft decisions). It is seen in this figure that the simulated 118 performance is very close to the theoretical curve 120.

Figure 19:
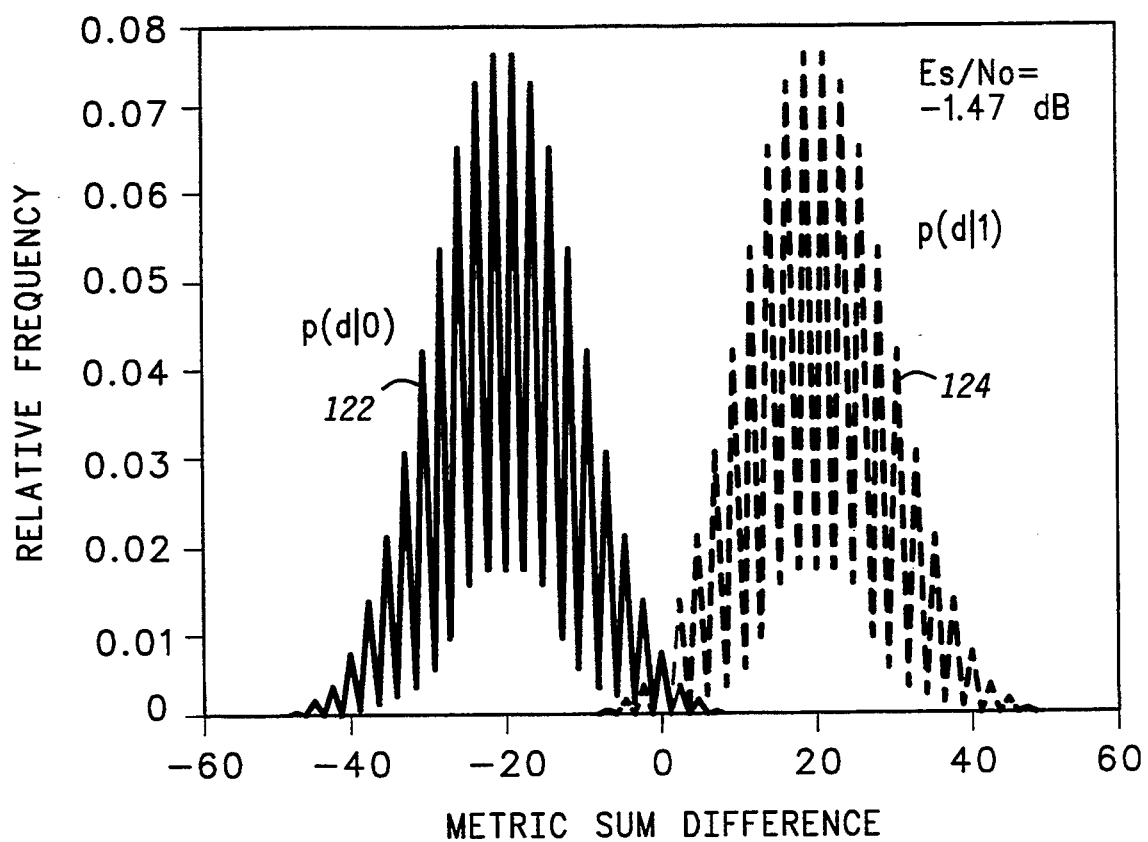
In FIG. 19, there is shown a histogram of the metric sum differences from the MLPC decoder for a channel symbol-to-noise density of −1.47 dB.

Further information of interest are histograms of the inner decoder output 94. FIG. 19 contains an example at the channel symbol energy to noise density ration ($E_s/N_o$) of 31 1.47 dB. One million bits were simulated to obtain the two curves. Note that the two curves 122, 124 in the plot each have a Gaussian shape. This was expected. The reason why is, each of the two constrained ML metric sums are sums of i independent and discrete Gaussian random variables (the channel soft decisions). Each sum is therefore Gaussian. Most of the random variables in the two sums are the same. Therefore, when the difference between the sums is taken these random variables are not a factor in the difference distribution. Only the random variables that are different are important.

It should be noted that in FIG. 19 many more even differences occur than odd ones. Initially, it is surprising that any odd differences occur at all. This is because all the lower weight code word sequences of the inner code 90 have even weight. In fact, this code 90 may have only even code word sequence weights. The difference between channel soft decisions, for an encoded sequence bit of 1 versus 0, is one of eight odd integers ($\pm 1$, $\pm 3$, $\pm 5$ and $\pm 7$). Summing an even number of odd integers yields an even number.

The reason why odd differences occur is, code word sequences are truncated by the inner decoder 94. This sometimes results in odd numbered Hamming distances between the two truncated code word sequences being compared. Summing an odd number of odd integers results in an odd number. FIG. 19 shows that this occurs infrequently. Most of the two constrained code word sequences have merged before the soft decision subtraction 13 is performed and therefore most differences are even. Extending the truncation length of the MLPC decoder 94 results in a reduction in the number of these odd differences.

Figure 20:
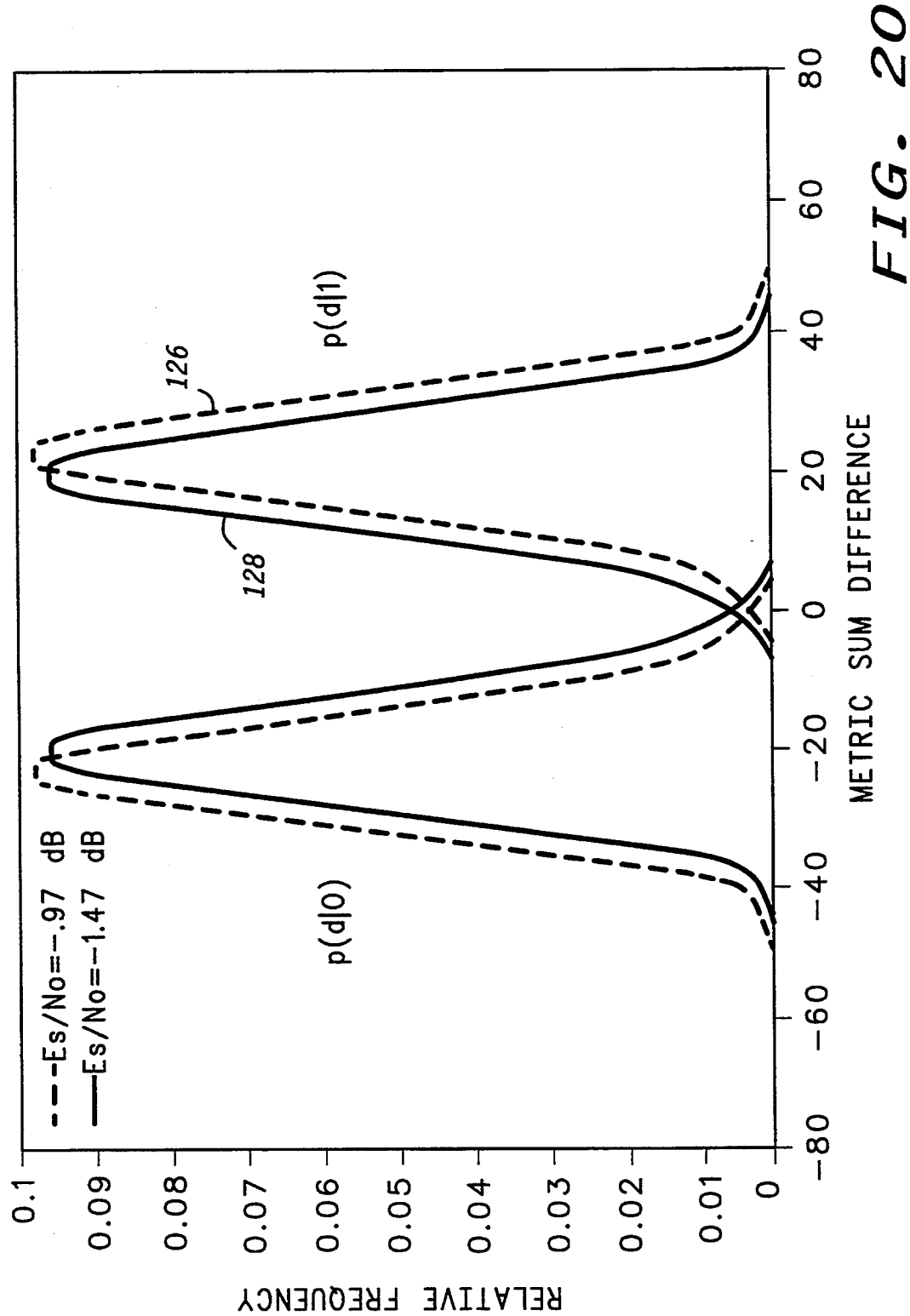
In FIG. 20, there is shown two histograms of the metric sum differences from the MLPC decoder for channel symbol-to-noise densities of −1.47 and −0.97 dB.

FIG. 20 contains two histograms 128,126 from the inner decoder output. Histogram 128 is at an $E_s/N_O$ of $-1.47$ dB and Histogram 128 at $-0.97$ dB. For these histograms, the only the even differences are shown for better clarity. For the higher $E_s/N_o$ ratio ($-0.97$ dB)

(histogram 126) the overlap of the two densities ($p(d|0)$) and $p(d|1)$ is less than at the smaller $E_s/N_o$ ratio (histogram 128). This soft decision behavior from the inner decoder is needed to provide the outer decoder with accurate reliability information.

Figure 21:
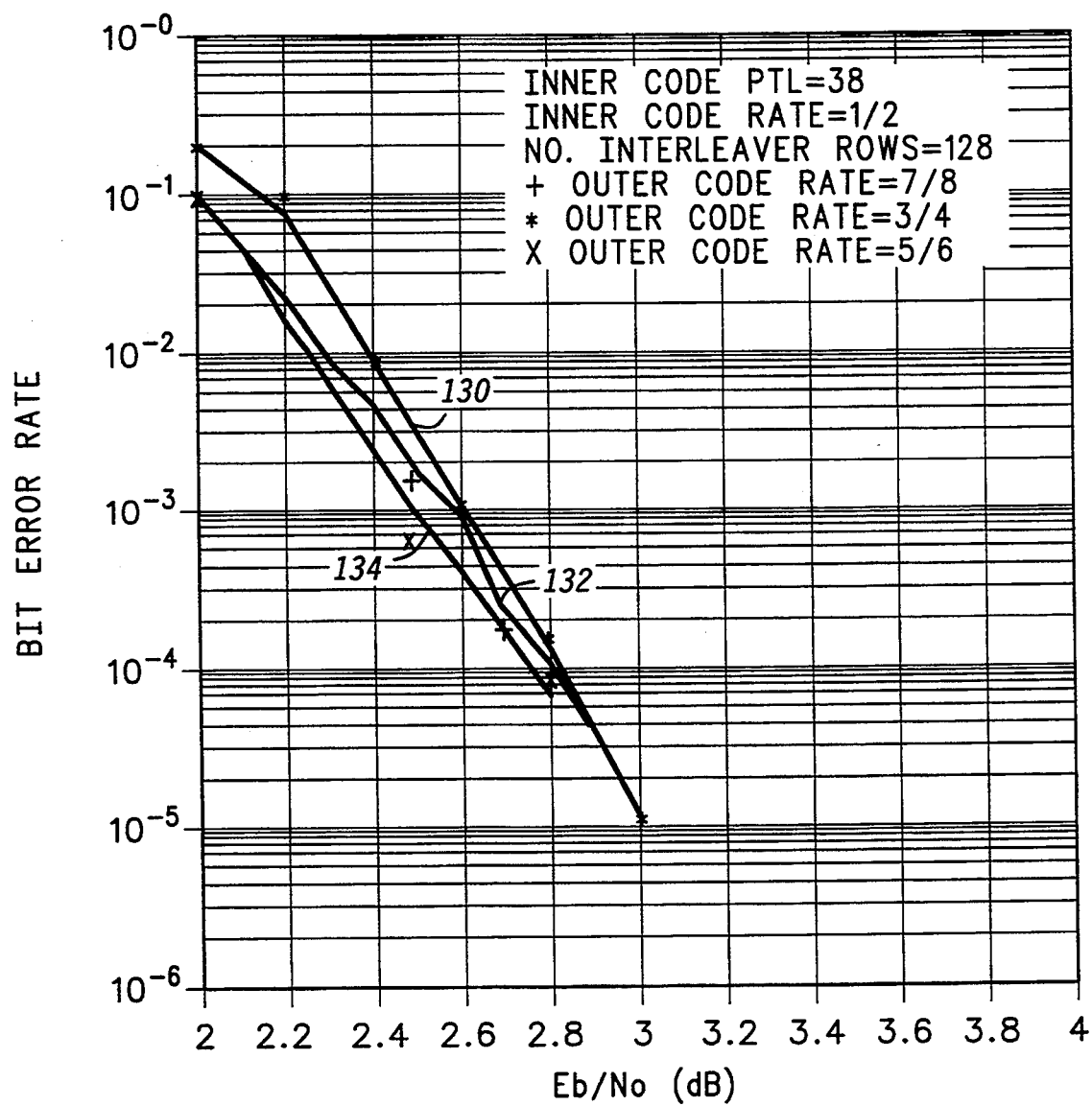
In FIG. 21, there is shown a plot of the simulated bit error rate performance versus bit energy/noise density ratio (Eb/No) for three different outer code rates for the communication link shown in FIG. 14.

FIG. 21 shows the simulated performance for three different outer code rates with the inner code rate fixed at $\frac{1}{2}$. The outer code rates are $\frac{3}{4}$(curve 130), 5/6 (curve 134), and 7/8 (curve 132). In the bit error rate region simulated, there is little difference in performance between the codes.

Figure 22:
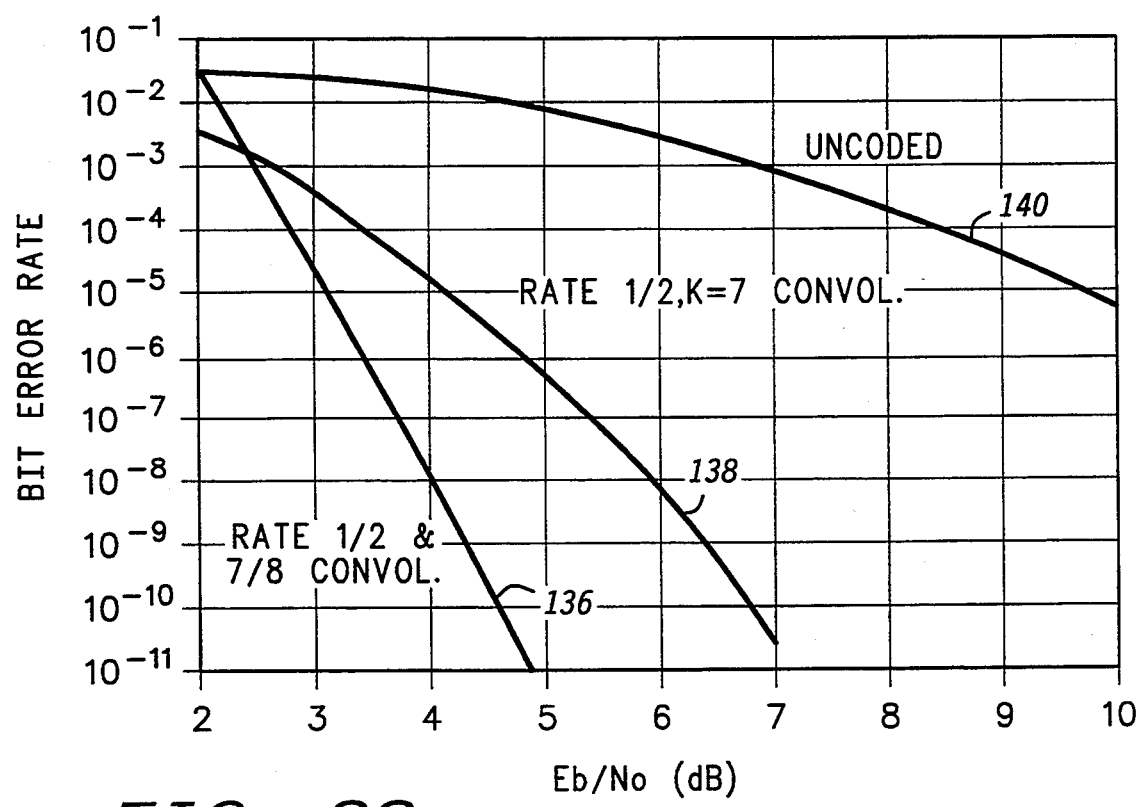
In FIG. 22, there is shown a plot of the analytical bit error rate performance of comparison between the communication link shown in FIG. 14, a rate ½ convolution code only and the uncoded data transmission.

It is interesting to compare the calculated performance of the concatenated code of curve 136 to a single rate $\frac{1}{2}$, K=7 convolution code and to the uncoded case. FIG. 22 shows this comparison. Soft decision usage is assumed for all decoders. The gain at a bit error rate of $10^{-6}$ is about 1.5 dB over the single convolutional code of curve 138 and over 7 dB versus the uncoded case of curve 140. The gain versus the single convolutional code of curve 138 grows to about 2.5 dB at the bit error rate of $10^{-11}$. This coding gain is competitive with long convolutional codes and a sequential decoder system. It also rivals the performance of a concatenated convolutional code (rate $\frac{1}{2}$, K=7) and Reed-Solomon (n=63, bits per symbol) system at the bit error rate of $10^{-6}$.

IMPLEMENTATION ISSUES DISCUSSION

The class of concatenated codes studied here have coding gain of about 1.5 dB larger than a single rate $\frac{1}{2}$ K=7 convolutional code at a bit error rate of $10^{-5}$. This performance is roughly equivalent to a convolutional code with a memory of M=12. It is important to quantitatively compare the encoder and decoder complexity for this code to the concatenated code. If a quantitative comparison is not possible then, a qualitative discussion is needed. This is the purpose of this subsection.

To minimize the factors considered in the complexity comparison, some assumptions are made, they are:
1. The decoders for both codes are Viterbi 52 or Viterbi-like for a MLPC decoder 94.
2. The decoders are designed for high data rates and therefore ACS blocks 26,28,30,32,34,36 are not time-shared.

The encoder complexity comparison is straight-forward. The concatenated code encoder 86,88,90 requires more circuitry. This is due to the interleaver 88. The convolutional interleaver 88 is not complex to implement since it is mainly memory.

The contribution of the encoder 86, 88, 90 to the overall complexity is small. In both systems, the most significant impact to the total complexity is due to the decoder 94,96,98. To compare the two decoders, an application specific integrated circuit (ASIC) implementation is assumed.

When discussing ASICs, a basic complexity measure is the number of logic gates or gates used. This will be a measure used here.

There are two major issues to consider when studying the implementation complexity of any circuit to be placed in an ASIC, they are:
1. Total number of gates used by the circuit.
2. Difficulty in connecting the gates together or gate interconnection complexity.

The first issue is addressed next for the m=12 Viterbi decoder and the concatenated code decoders 84,96,98.

In a fully parallel ASIC implementation of a Viterbi decoder, most of the gates are utilized by two separate functions, they are:
1. The ACS circuits,
2. Path memory circuits.

For a code rate of $\frac{1}{2}$ and a constraint length of 7, the ACS and path memory circuits each share about 50% of the total decoder hardware. The total number of gates in the Viterbi decoder for this code is about 50,000 gates. With a path memory length of 5 constraint lengths or 35, there are $35 \times 64 = 2240$ memory locations. Since 25,000 gates are needed for the memory, the number of gates per memory element is $25,000/2240 \approx 11$. The number of gates per ACS block is $25,000/2^6 \approx 390$. The gate counts for the two decoders being studied will be calculated using these numbers.

The single Viterbi decoder for the rate $\frac{1}{2}$, K=13 code needs $5 \times 13 \times 2^{12} = 266,240$ path memory bits. Multiplying this number by 11 gates per bit yields about 3,000,000 gates. It would also require 4096 ACS blocks at gates each or about 1,600,000 gates. The total number of gates is therefore 4,600,000. This is 10 times larger than the number of usable gates in the largest existing (1992) ASICs.

For the complexity comparison, the assumed architecture for the MLPC decoder 94 in the concatenated code decoder 94,96,98 is number 4. With this assumption, the most significant items required for the inner and outer decoders are:
1. One Viterbi decoder 52 in the MLPC decoder 94 for a rate $\frac{1}{2}$, K=7 code.
2. 33 ACSDs 3, 26,34 in the MLPC decoder 94.
3. A convolution deinterleaver 96 with a size of (128,128).
4. One Viterbi decoder 52 for the outer decoder 98 for a rate $\frac{1}{2}$, K=7 code.

From prior discussions, items 1 and 4 require about 50,000 gates each.

The number of ACS blocks in item 2 are $33 \times 64 = 2112$. At 390 gates per ACS block, a total of 823,680 gates are needed for item 3.

In this disclosure, the deinterleavers 96 used in the simulation studies had 7 bit word sizes. This can probably be reduced to 3–4 bits per word without much of a performance loss. Since this issue was not studied, 7 bits per word is assumed. The total number of deinterleaver 96 memory locations is $128^2/2 = 8192$. The total number of bits in the deinterleaver 96 is therefore $8192 \times 7 = 57,344$.

Deinterleavers 96 are single-input, single-output memory devices. Shift registers or random access memory (RAM) can therefore be used to build them. Shift registers require about 10 gates per input bit. An ASIC is therefore an inefficient way of creating large memories. This fact is apparent when considering the total path memory gate counts in the 4096 state Viterbi decoder. RAM can be implemented more efficiently in an ASIC. One ASIC vendor can obtain less than one gate per bit. Assuming the deinterleaver 96 is RAM-based and inside the ASIC then about 50,000 gates are required for the deinterleaver 96.

Using the numbers above, the total number of gates needed for the concatenated code decoder 94,96,98 is approximately 1,000,000. This total is 2 times the current state-of-the-art ASIC sizes. It is also 4–5 times fewer gates than the Viterbi decoder for the m=12 code.

The use of a single RAM for the path memory in the 4096 state Viterbi decoder is not possible. The reason is the path memory is distributed throughout the decoder and is multi-input, multi-output. Shift register usage for each of the 4096 separate path memories is the most efficient implementation.

In summary, the number of gates needed to implement the 4096 state Viterbi decoder is about 4,600,000. For the concatenated code decoder, the gate count is about 1,000,000. The concatenated code decoder is therefore 4-5 times less complex using the gate count comparison alone.

The second implementation comparison considers the ASIC interconnection difficulty level. Obtaining a quantitative comparison on this issue is not easily done. A qualitative comparison will therefore be performed.

There is one important fact that will be used for the interconnection comparison. For (very large scale integrated) VLSI circuits, cost and performance metrics favor architectures in which on-chip interprocessor communication is localized. The concatenated code decoder has this feature. The MLPC decoder 94 which represents most of the gate count, is composed of about 35 sets of ACSDs 3,26,30,34. Each ACSD has only 64 ACS. Each ACSD communicates with neighboring ACSDs only. The 4096 state Viterbi decoder does not enjoy this advantage. Each of the 4096 ACSs connects to two other ACSs. Some connections are localized while others are not.

From the above discussion, it is apparent that the concatenated code decoder has the clear ASIC interconnection advantage. The advantage is difficult to quantify in general though. Two specific designs could be compared to obtain numbers for the comparison but this is beyond the scope of this disclosure and will not be attempted.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A method for decoding information coded by an encoder having a memory length of m bits and transmitted through a noisy channel, said method comprising the steps of:

comparing the transmitted information to all possible predetermined output states of the encoder to determine for each bit received through the channel a first $2^m$ set of metric sums representing the likelihood that a one was input to the encoder, and a second $2^m$ set of metric sums representing the likelihood that a zero was input to the encoder;

passing the first $2^m$ set of metric sums through a first trellis decoder to produce a first output;

passing the second $2^m$ set of metric sums through a second trellis decoder to produce a second output;

selecting a first maximum metric sum from the first output and a second maximum metric sum from the second output; and subtracting the first and second maximum metric sums from each other to determine a difference therebetween having a sign and magnitude, wherein the sign of the difference indicates the relative likelihood that a one or zero was encoded by the encoder and the magnitude of the difference indicates the probability that such one or zero was encoded by the encoder.

2. The method of claim 1 wherein a difference of positive sign indicates that a one is relatively more likely to have been encoded by the encoder.

3. The method of claim 1 wherein a difference of negative sign indicates that a one is relatively more likely to have been encoded by the encoder.

4. The method of claim 1 wherein at least one of the passing steps is carried out using a Viterbi decoder.

5. An apparatus for decoding information coded by an encoder having a memory length of m bits and transmitted through a noisy channel, comprising:

an input add-compare-select decoder for receiving the transmitted information and producing a first output containing information on the likelihood that an encoded bit was a one and a second output containing information on the likelihood that the encoded bit was a zero;

a first multiplicity of sequentially connected add-compare-select decoders, the first thereof receiving the first output and the last thereof producing a first further output;

a second multiplicity of sequentially connected add-compare-select decoders, the first thereof receiving the second output and the last thereof producing a second further output;

a first selector for receiving the first further output and selecting therefrom a first maximum sum of probabilities that the encoded bit was a one;

a second selector for receiving the second further output and selecting therefrom a second maximum sum of probabilities that the encoded bit was a zero; and a subtractor for determining sign and magnitude of a difference between the first and second maximum sum of probabilities, wherein the sign of the difference indicates whether a one or zero was relatively more likely to have been encoded by the encoder and the magnitude of the difference indicates the probability that such one or zero was encoded by the encoder.

6. The apparatus of claim 5 wherein a difference of positive sign indicates that a one was more likely encoded by the encoder and a difference of negative sign indicates that a zero was more likely encoded by the encoder.

7. The apparatus of claim 5 wherein a difference of negative sign indicates that a one was more likely encoded by the encoder and a difference of positive sign indicates that a zero was more likely encoded by the encoder.

8. The apparatus of claim 5 wherein at least one of the first and second multiplicity of decoders comprises a Viterbi decoder.

9. A method for decoding information coded by a convolutional encoder having a memory length of m bits and transmitted through a noisy channel, said method comprising the steps of:

processing the transmitted information through at least one trellis decoder to produce, for each input data bit to the encoder, (i) a first $2^m$ set of metric sums representing the likelihood that a one was input to the encoder, and (ii) a second $2^m$ sets of metric sums representing the likelihood that a zero was input to the encoder;

selecting from the first $2^m$ set of metric sums a first maximum metric sum;

selecting from the second $2^m$ set of metric sums a second maximum metric sum; and subtracting the first and second maximum metric sums from each other to determine a sign and magnitude of a difference therebetween, wherein the sign of the difference indicates the relative likelihood that a one or zero was encoded by the encoder and the magnitude of the difference indicates the probability that such one or zero was encoded by the encoder.

10. The method of claim 9 wherein the processing step comprises processing the transmitted information through multiple trellis decoders.

* * * * *